United States Patent
Nishizono

(10) Patent No.: US 8,283,934 B2
(45) Date of Patent: Oct. 9, 2012

(54) CAPACITANCE SENSOR FOR DETECTING A CHARGE VOLTAGE OF A MULTI-CAPACITOR CIRCUIT

(75) Inventor: Kazunori Nishizono, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 403 days.

(21) Appl. No.: 12/401,174

(22) Filed: Mar. 10, 2009

(65) Prior Publication Data

US 2009/0224775 A1 Sep. 10, 2009

(30) Foreign Application Priority Data

Mar. 10, 2008 (JP) ................................. 2008-059779

(51) Int. Cl.
*G01R 27/26* (2006.01)
*G06F 3/041* (2006.01)

(52) U.S. Cl. ........................................ 324/658; 345/173

(58) Field of Classification Search ............. 324/658
See application file for complete search history.

(56) References Cited

U.S. PATENT DOCUMENTS

| | | | |
|---|---|---|---|
| 5,059,910 A * | 10/1991 | Ochi | 324/537 |
| 5,661,240 A * | 8/1997 | Kemp | 73/514.32 |
| 6,466,036 B1 * | 10/2002 | Philipp | 324/678 |
| 6,744,258 B2 * | 6/2004 | Ishio et al. | 324/548 |
| 7,078,887 B1 * | 7/2006 | Eckhardt et al. | 324/76.53 |
| 7,148,697 B2 * | 12/2006 | Doljack | 324/548 |
| 7,385,404 B2 * | 6/2008 | Puma et al. | 324/548 |
| 7,839,392 B2 * | 11/2010 | Pak et al. | 345/173 |
| 8,089,288 B1 * | 1/2012 | Maharita | 324/678 |
| 2006/0037393 A1 | 2/2006 | Itakura et al. | |
| 2006/0232567 A1 * | 10/2006 | Westerman et al. | 345/173 |

FOREIGN PATENT DOCUMENTS

| | | |
|---|---|---|
| JP | 1-61669 A | 3/1989 |
| JP | 2000-65514 A | 3/2000 |
| JP | 2006-58084 A | 3/2006 |

* cited by examiner

*Primary Examiner* — Jeff Natalini
(74) *Attorney, Agent, or Firm* — Fujitsu Patent Center

(57) ABSTRACT

A capacitance sensor includes a first charging voltage detector configured to detect a change in a voltage loaded into a first capacitor between an electrode and a ground terminal a second charging voltage detector configured to detect a change in a voltage loaded into a second capacitor among a plurality of electrodes and a determiner configured to generate a determination signal based on a detection voltage transmitted from each of the first charging voltage detector and second charging voltage detector.

16 Claims, 20 Drawing Sheets

CAPACITANCE SENSOR FOR DETECTING A CHARGE VOLTAGE OF A MULTI-CAPACITOR CIRCUIT

CROSS-REFERENCE TO RELATED APPLICATIONS

This application is based upon and claims the benefit of priority of the prior Japanese Patent Application No. 2008-059779, filed on Mar. 10, 2008, the entire contents of which are incorporated herein by reference.

FIELD

The embodiments discussed herein are related to a capacitance sensor which transmits a detection signal indicating that a change in a charge loaded into a capacitor has been detected.

BACKGROUND

A capacitance sensor used in a touch sensor, by detecting a change in a capacitance among a plurality of electrodes with a detection circuit, can detect a touch of an object to be detected such as a human body or the like.

FIG. 18 illustrates one example of a detection principle of the capacitance sensor. As detection elements, two electrodes 1a and 1b are spaced a certain distance apart on a substantially identical plane, and the electrodes 1a and 1b are covered with an insulator 2. For the electrodes 1a and 1b, as illustrated in FIG. 19, for example, the electrode 1b may be laid out around the electrode 1a, and furthermore, a guard member 3 may be laid out around the electrode 1b, keeping the electrodes in electrical isolation from another electrode. Then, both electrodes 1a and 1b are covered with the insulator.

Then, as illustrated in FIG. 18, as a capacitance Cs1 between the electrodes 1a and 1b or capacitances Cs2 and Cs3 between each electrode 1a and 1b and a ground GND change when the isolator insulator 2 on the electrodes 1a and 1b is touched with a finger, an existence of a touch with a finger may be detected by detecting the change in the capacitances with a detection circuit.

A capacitance sensor illustrated in FIG. 20 includes an electrode 6 disposed in a mounting hole 5 in an insulator 4. The electrode 6 is covered with a flexible conductive material 7 spaced a certain distance away therefrom. When the conductive material 7 is pressed and flexed, a distance between the conductive material 7 and the electrode 6 is reduced, a capacitance between the conductive material 7 and the electrode 6 changes, and, by detecting the change in the capacitance by a detection circuit, an existence of a touch with a finger is detected.

In the kind of capacitance sensor illustrated in FIG. 18, by adopting a configuration wherein a change in the capacitance Cs1 is detected by the detection circuit, a change in the capacitance Cs1 due to a touch with a finger is comparatively large and relatively unsusceptible to a parasitic capacitance. Therefore, it is possible to detect the existence of a touch with a high accuracy. However, since a detection signal similar to a detection signal obtained from a touch with a finger may be transmitted even when a water droplet or other conductive material adheres to the insulator 2, problems such as malfunctions can occur.

Also, in the event of adopting a configuration wherein a change in the capacitance Cs2 between the electrode 1a and the ground GND, or the capacitance Cs3 between the electrode 1b and the ground GND, is detected by the detection circuit, such a change in capacitance is susceptible to a parasitic capacitance between each electrode 1a and 1b and the ground GND, thus reducing detection accuracy.

Therefore, when a configuration with a function of canceling a parasitic capacitance every time is provided in the detection circuit, and with improved detection accuracy by a calibration operation is adopted, there is a problem in that the scale of the detection circuit increases.

As a disclosed technology, a sensor circuit which detects a change in a capacitance between two electrodes is disposed in JP-A-2000-65514.

Also, a humidity sensor which detects humidity by detecting a capacitance changing in accordance with a change in humidity is disclosed in JP-A-2006-58084.

SUMMARY

According to an aspect of the invention, a capacitance sensor includes a first charging voltage detector configured to detect a change in a voltage loaded into a first capacitor between an electrode and a ground terminal a second charging voltage detector configured to detect a change in a voltage loaded into a second capacitor among a plurality of electrodes and a determiner configured to generate a determination signal based on a detection voltage transmitted from each of the first charging voltage detector and second charging voltage detector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
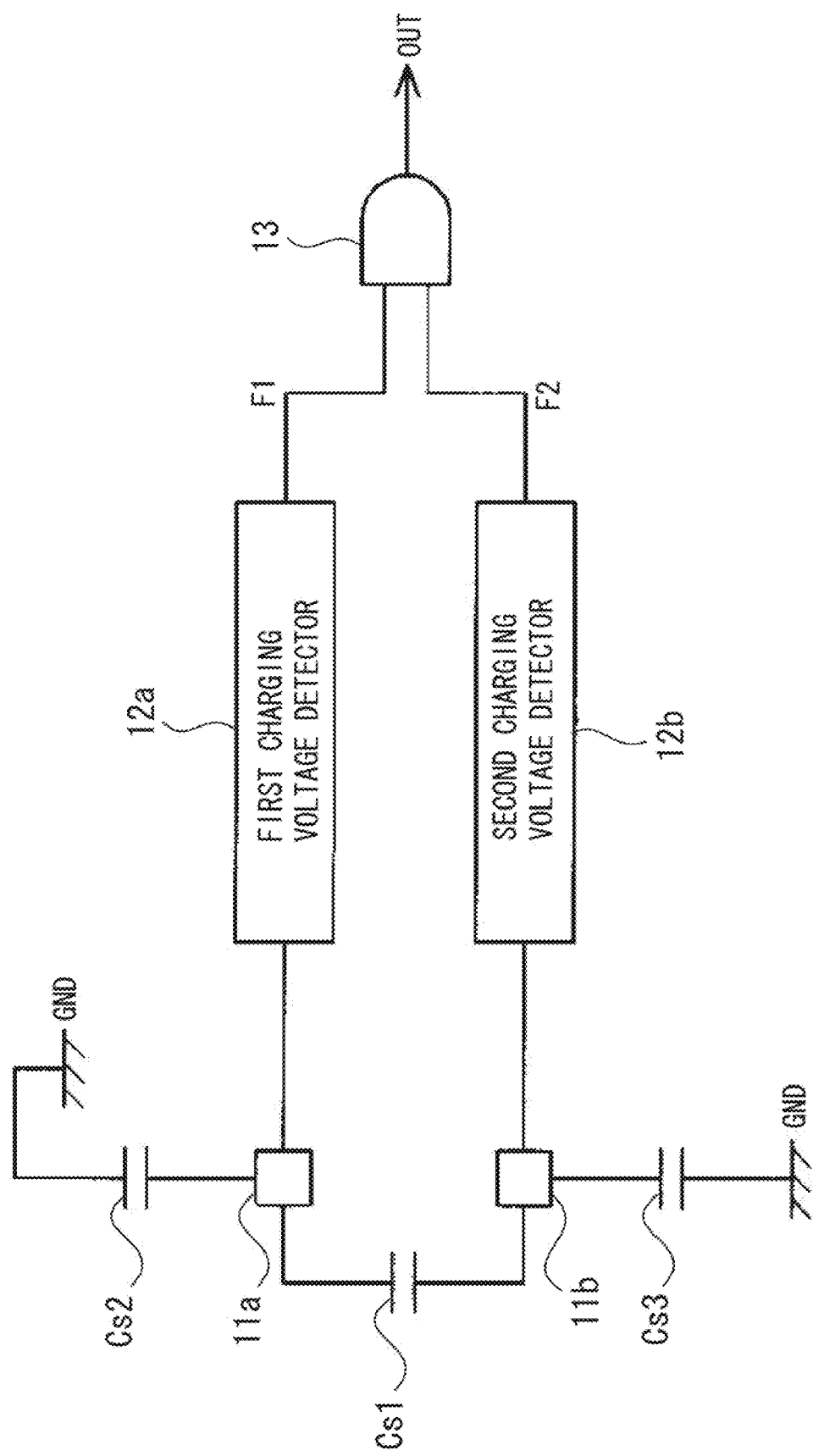
FIG. 1 illustrates a capacitance sensor of an embodiment.
Figure 19:
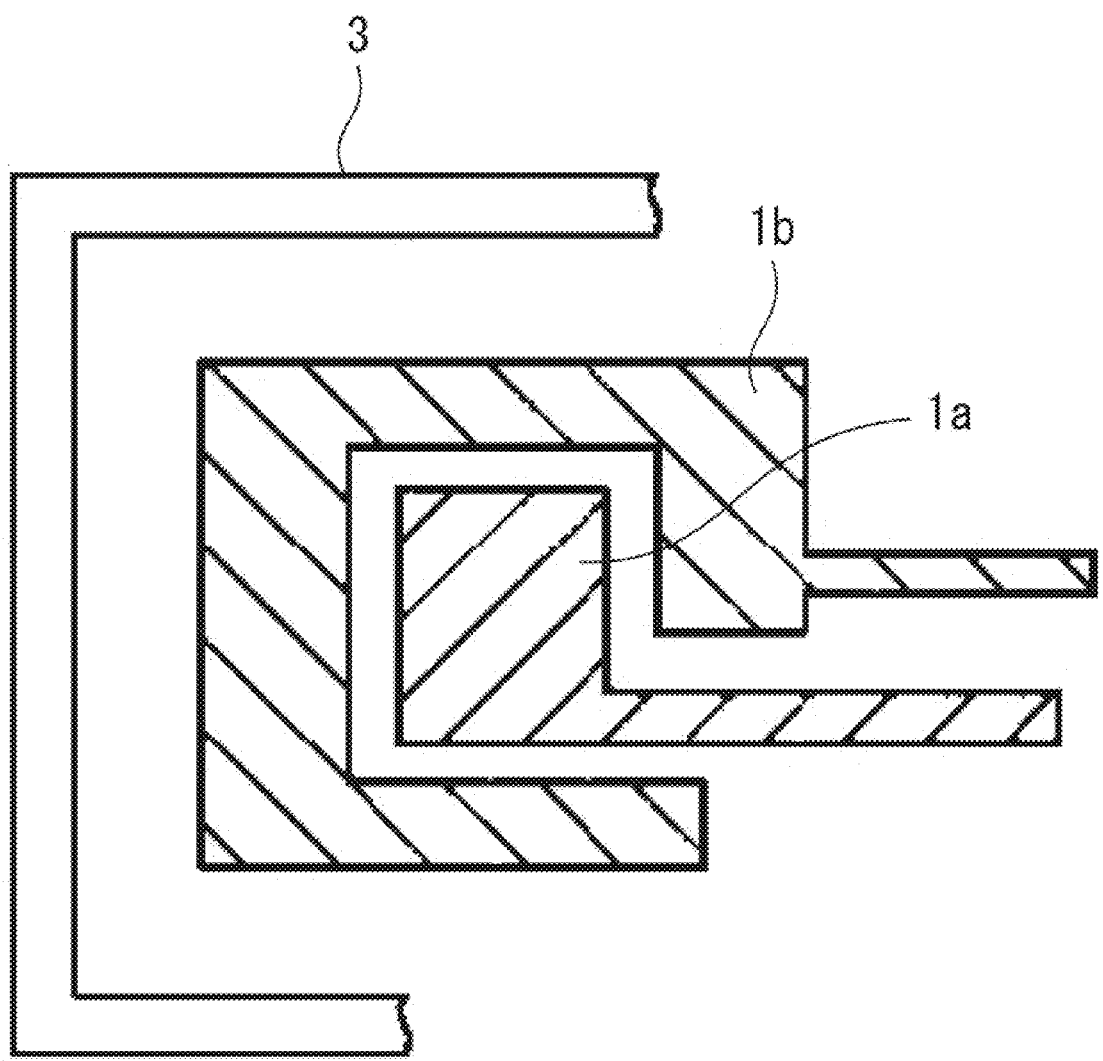
FIG. 19 is a layout diagram illustrating a heretofore known electrode example.
Figure 20:
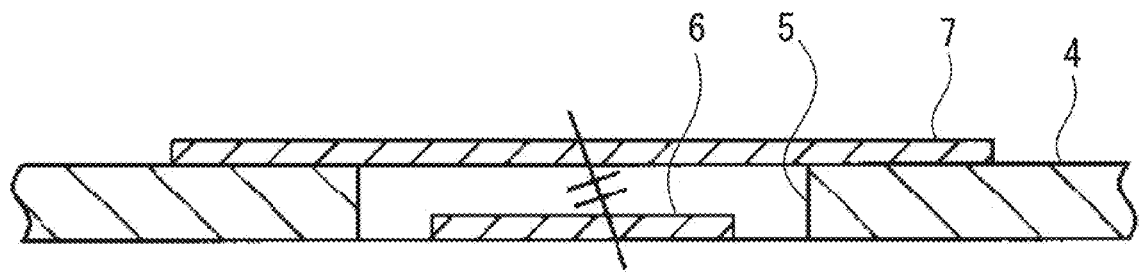
FIG. 20 is a sectional view illustrating another heretofore known electrode example.

Hereafter, a description will be given, in accordance with the drawings, of an embodiment of the invention. FIG. 1 illustrates a principle of a capacitance sensor of the embodiment. Electrodes 11a and 11b, being electrodes of a touch sensor switch, are configured in the same way as the electrodes 1a and 1b illustrated in FIG. 19. A capacitor (a second capacitor) Cs1 is provided between the electrodes 11a and 11b, and capacitors Cs2 and Cs3 are provided respectively between electrode 11a and a ground GND (a ground terminal) and 11b and a ground GND.

A first charging voltage detector 12a, which detects a voltage loaded into the capacitor (a first capacitor) Cs2 between the electrode 11a and the ground GND, is coupled to the electrode 11a, and a second charging voltage detector 12b which detects a voltage loaded into the capacitor Cs1 between the electrodes 11a and 11b is coupled to the electrode 11b.

The first charging voltage detector 12a, on detecting a change in the voltage loaded into the capacitor Cs2, transmits a detection flag F1 to a determiner 13. Also, the second charging voltage detector 12b, on detecting a change in the voltage loaded into the capacitor Cs1, transmits a detection flag F2 to the determiner 13.

When both detection flags F1 and F2 are input, the determiner 13, based on a logical AND of the detection flags F1 and F2, transmits a determination signal OUT which indicates that a position over the electrodes 11a and 11b has been touched with a finger.

Figure 2:
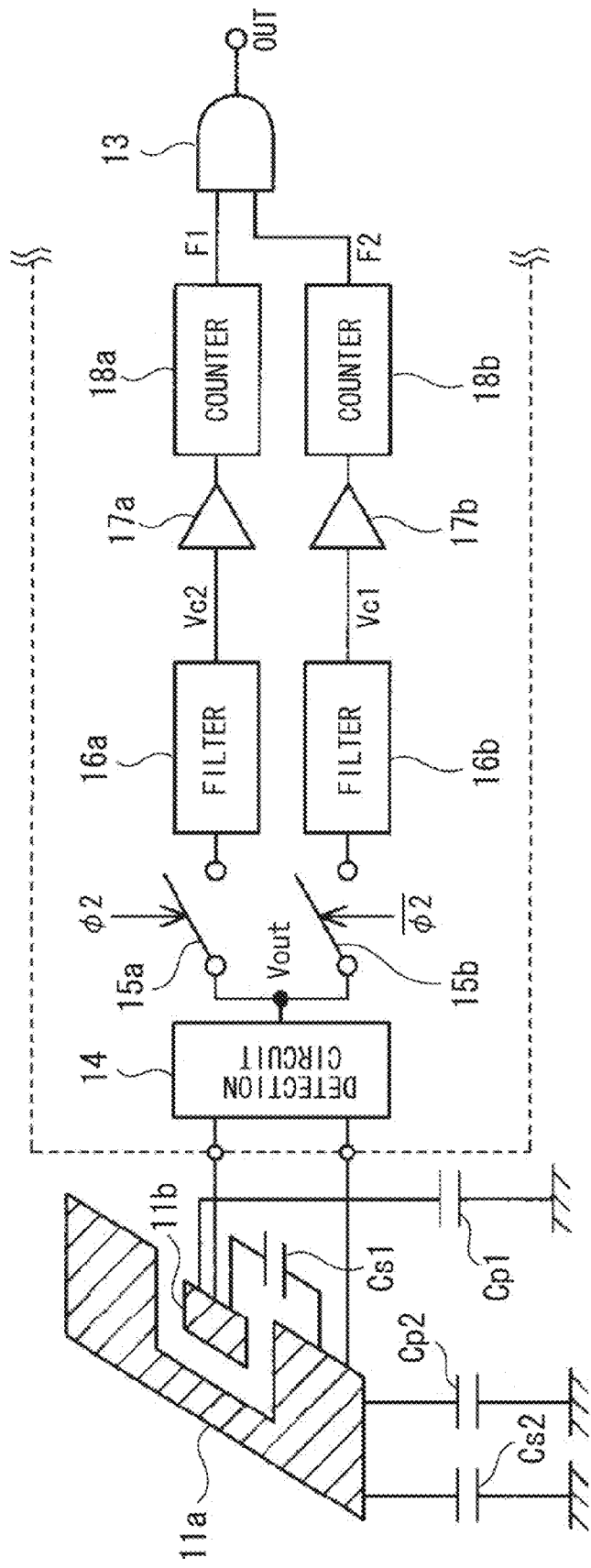
FIG. 2 is a block diagram illustrating a capacitance sensor of a first embodiment.

FIG. 2 illustrates a detailed configuration of the first and second charging voltage detectors 12a and 12b. The electrodes 11a and 11b are coupled to a detection circuit 14. The detection circuit 14 detects the voltages loaded into the capacitors Cs1 and Cs2 in a time division manner, and transmits the voltages. Consequently, the detection circuit 14 is shared by the first and second charging voltage detectors 12a and 12b.

A signal Vout output from the detection circuit 14, is transmitted to a filter 16a through a switch 15a, and to a filter 16b through a switch 15b. The filters 16a and 16b, being low pass filters, remove a high frequency component of noise from the output signal Vout.

Figure 3:
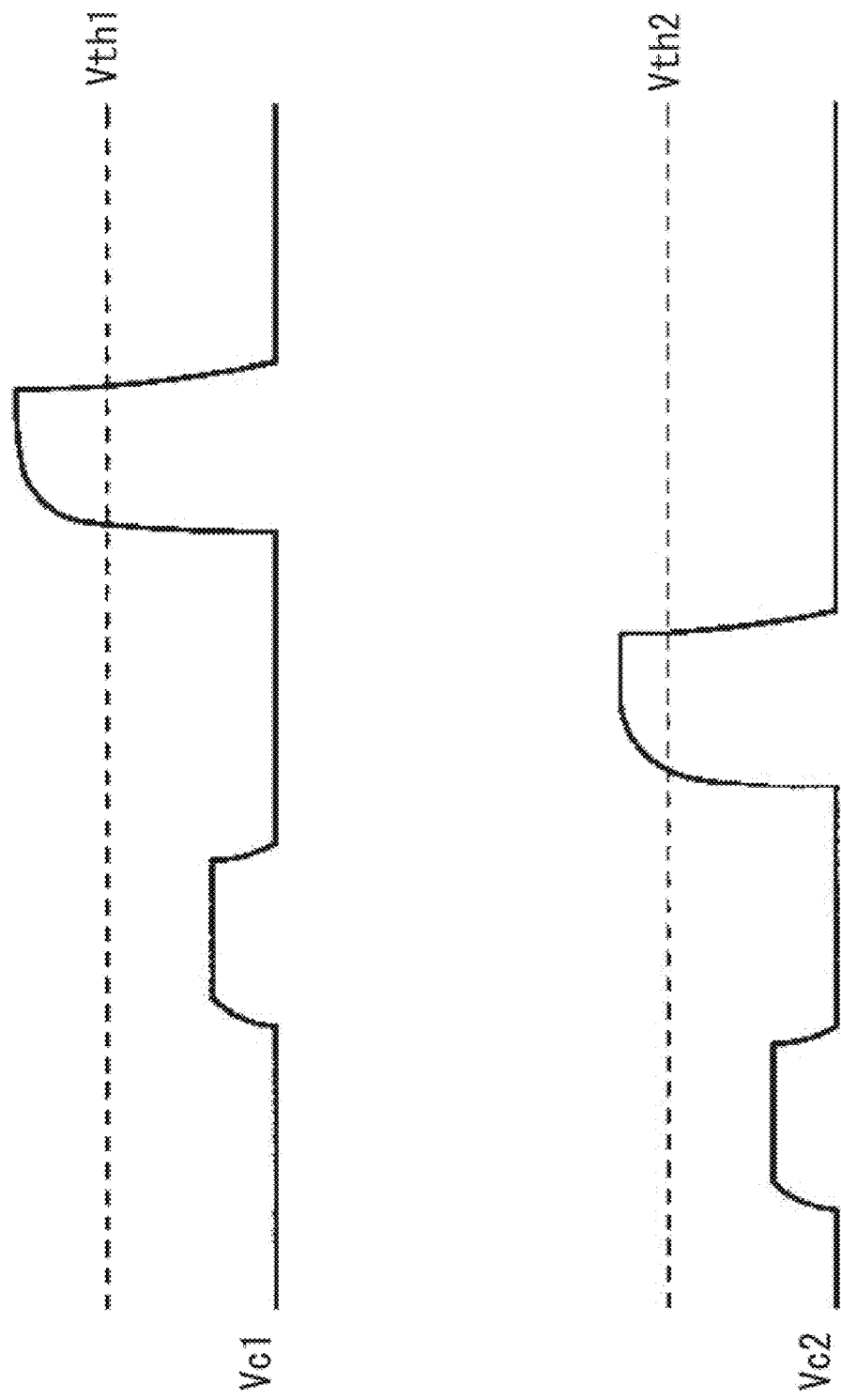
FIG. 3 is an explanatory diagram illustrating an operation of a comparator.

A signal output from the filter 16a is input into a comparator (a first comparator) 17a, while a signal output from the filter 16b is input into a comparator (a second comparator) 17b. As illustrated in FIG. 3, the comparators 17a and 17b respectively compare detection voltages Vc2 and Vc1, to be described hereafter, transmitted from the filters 16a and 16b with thresholds Vth1 and Vth2 (Vth2: a first threshold, and Vth1: a second threshold). When the voltage levels of the detection voltages Vc1 and Vc2 respectively exceed the thresholds Vth1 and Vth2, the comparators 17a and 17b transmit output signals of an H level.

The signals output from the comparators 17a and 17b are transmitted respectively to counters (a first counter and a second counter) 18a and 18b. The counters 18a and 18b carry out a count-up operation every time the signals output from the comparators 17a and 17b reach the H level, and, when a count number reaches a certain number, transmit the detection flags (a first detection flag and a second detection flag) F1 and F2 to the determiner 13.

Figure 4:
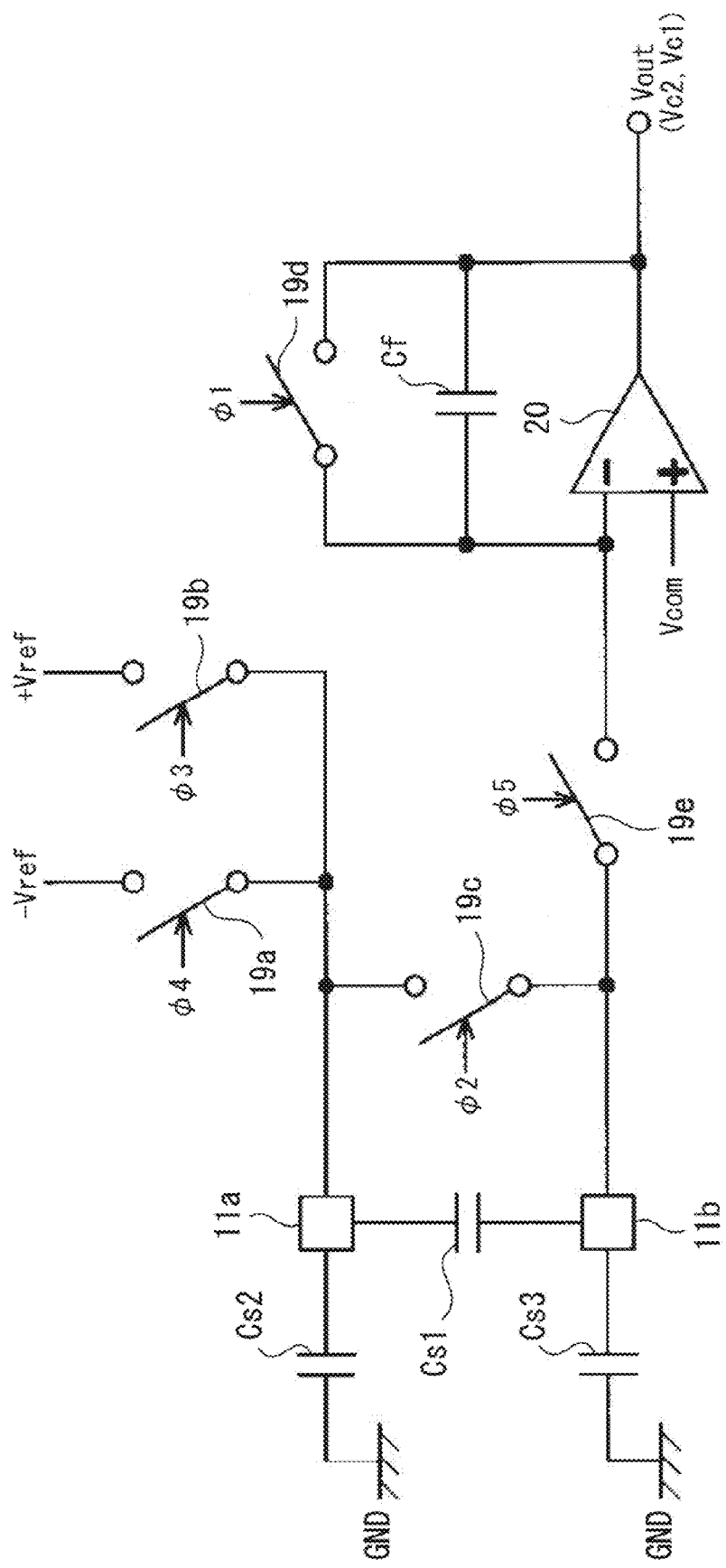
FIG. 4 is a circuit diagram illustrating a detection circuit.

A description will be given, in accordance with FIG. 4, of a specific configuration of the detection circuit 14. A switch (a fourth switch) 19a open/close-controlled by a control signal $\phi 4$, is coupled to the electrode 11a, and supplies a low potential side reference voltage •Vref to the electrode 11a when conducting. Also, a switch (a third switch) 19b open/close-controlled by a control signal $\phi 3$ is coupled to the electrode 11a, and supplies a high potential side reference voltage •Vref to the electrode 11a when conducting. The high potential side reference voltage •Vref may be made a supply voltage, and the low potential side reference voltage •Vref may be made a ground GND potential.

A switch (a second switch) 19c open/close-controlled by a control signal $\phi 2$ is coupled between the electrodes 11a and 11b, while a switch 19e open/close-controlled by a control signal $\phi 5$ is coupled between the electrode 11b and a negative side input terminal of an operational amplifier 20. Then, on the switch 19c becoming conductive, a short-circuit condition occurs between the electrodes 11a and 11b, and furthermore, on the switch 19e becoming conductive, the electrode 11a is coupled to the negative side input terminal of the operational amplifier 20.

The electrode 11b is coupled to the negative side input terminal of the operational amplifier 20 via the switch 19e, and a reference voltage Vcom is input into a positive side input terminal of the operational amplifier 20. Also, a feedback capacitor Cf and a switch (a first switch) 19d are coupled between the input and output terminals of the operational amplifier 20.

The switch 19d is open/close-controlled by a control signal $\phi 1$. When the switch 19d conducts, the switch 19d is coupled to the input and output terminals of the operational amplifier 20. In the event that there is no offset in the operational amplifier 20, the output signal Vout reaches a reference voltage Vcom level.

Figure 5:
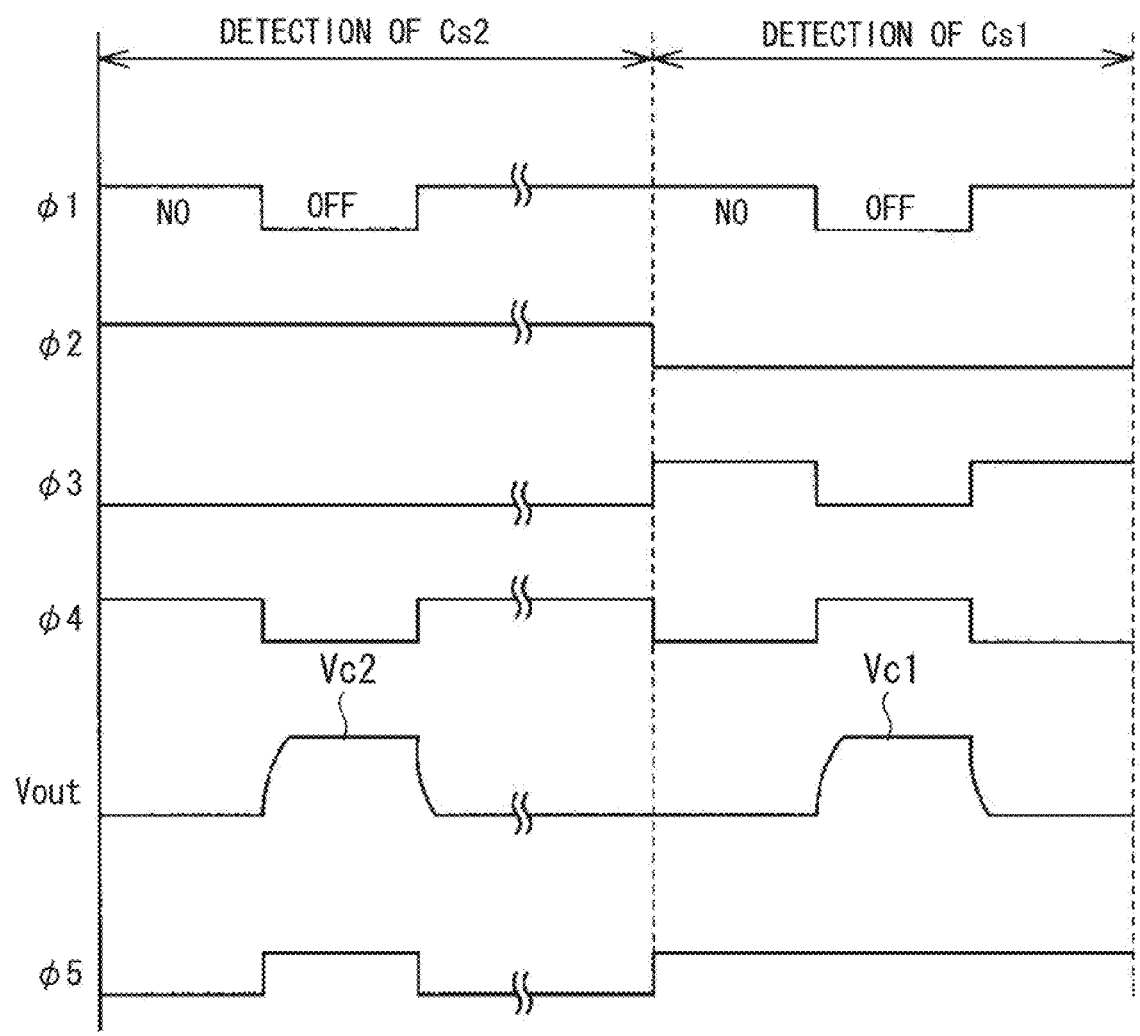
FIG. 5 is a timing waveform diagram illustrating an operation of the detection circuit.

A description will be given, in accordance with FIG. 5, of an operation of the detection circuit configured as described above. The switches 19a to 19e become conductive when the control signals $\phi 1$ to $\phi 5$ reach the H level.

On a detection operation being started, firstly, the control signal $\phi 2$ reaches the H level, and the switch 19c is rendered conductive.

In this condition, a signal which switches between the H level and an L level in a certain period is supplied as the control signal $\phi 1$, and the control signal $\phi 4$ in the same phase as that of the control signal $\phi 1$, and the control signal $\phi 5$ in a reverse phase as that of the control signal $\phi 1$ are also supplied.

Thus, when the control signals $\phi 1$ and $\phi 4$ reach the H level, and the control signal $\phi 5$ reaching the L level, both terminals of the feedback capacitor Cf are short-circuited, the feedback capacitor Cf is discharged, and the output signal Vout reaches the reference voltage Vcom. The capacitors Cs2 and Cs1 coupled to the electrode 11a are discharged up to a reference voltage •Vref level.

Then, when the control signals $\phi 1$ and $\phi 4$ reach the L level, and the control signal $\phi 5$ reaches the H level, the switches 19a and 19b become non-conductive, and the switch 19e becomes conductive. Thus, the detection voltage Vc2 based on a charge loaded into the capacitor Cs2 is transmitted as the output signal Vout from the operational amplifier 20 and, a relationship Vc2·Cs2·Cf·Vref being established, a voltage based on a ratio of capacitance values of the capacitor Cs2 and the feedback capacitor Cf is transmitted. Consequently, as the charge loaded into the capacitor Cs2 increases, for example, when an insulator on the electrodes 11a and 11b is touched with a finger, the detection voltage Vc2 increases.

Then, when the control signals φ1, φ4 and φ5 switch, the output signal Vout reaches the reference voltage Vcom. Then, the detection voltage Vc2, based on the switching of the control signals φ1, φ4 and φ5, is repeatedly transmitted as the output voltage Vout.

The detection voltage Vc2 is transmitted to the comparator 17a through the conducting switch 15a based on the control signal φ2 and the filter 16a. Then, in the comparator 17a, as illustrated in FIG. 3, an output signal, which reaches the H level in the event that the detection voltage Vc2 exceeds the threshold Vth1, is transmitted to the counter 18a. The counter 18a counts pulse signals transmitted from the comparator 17a and, on counting up to a number of pulses set in advance, transmits the detection flag F1 of the H level to the determiner 13.

In the heretofore described kind of operation of detecting the charge loaded into the capacitor Cs2, since the switch 19c is conductive, a value is detected which is a combination of the charge loaded into the capacitor Cs2 and a charge loaded into the capacitor Cs3 between the electrode 11b and the ground GND.

After the detection of the detection voltage Vc2, the control signal φ2 reaches the L level, and a shift is made to an operation of detecting a charge loaded into the capacitor Cs1. As a timing of this shift, it is also acceptable to make the shift after the detection flag F1 has been transmitted as described above, or to make the shift after a specified time.

Upon the control signal φ2 reaching the L level, the switch 19c becomes non-conductive. In this condition, a signal which switches between the H level and the L level in a certain period is supplied as the control signal φ1. The control signal φ3 in the same phase as that of the control signal φ1, the control signal φ4 in a reverse phase of the control signal φ1, and the control signal φ5 of the H level are supplied.

Thus, upon the control signals φ1 and φ3 reaching the H level, and the control signal φ4 reaching the L level, both end outputs of the feedback capacitor Cf are short-circuited, the feedback capacitor Cf is discharged, and the output signal Vout reaches the reference voltage Vcom. Also, the capacitors Cs2 and Cs1 are charged up to a reference voltage •Vref level.

Next, upon the control signals φ1 and φ3 reaching the L level, and the control signal φ4 reaching the H level, the reference voltage •Vref is supplied and the switch 19d becomes non-conductive. Thus, the detection voltage Vc1 based on the charge loaded into the capacitor Cs1 is transmitted as the output signal Vout. With a relationship Vc1=2·Cs1/Cf·Vref being established, a voltage based on a ratio of charges loaded into the capacitor Cs1 and feedback capacitor Cf is transmitted. Consequently, as the charge loaded into the capacitor Cs1 increases, that is, when the insulator on the electrodes 11a and 11b is touched with a finger, the detection voltage Vc1 increases.

Then, upon the control signals φ1, φ3 and φ4 switching, the output signal Vout reaches the reference voltage Vcom. Then, the detection voltage Vc1, based on the switching of the control signals φ1, φ3 and φ4, is repeatedly transmitted as the output signal Vout.

The detection voltage Vc1, based on a control signal φ2 bar which is an inverted signal of the control signal φ2, is transmitted to the comparator 17b through the conducting switch 15b and the filter 16b. Then, with the comparator 17b, as illustrated in FIG. 3, an output signal, which reaches the H level in the event that the detection voltage Vc1 exceeds the threshold Vth1, is transmitted to the counter 18b. The counter 18b counts pulse signals transmitted from the comparator 17b and, on counting up to a number of pulses set in advance, transmits the detection flag F2 of the H level to the determiner 13.

In the heretofore described kind of detection operation, since a charging potential of the capacitor Cs2 is greatly affected by parasitic capacitors Cp1 and Cp2 of the electrodes 11a and 11b, an arrangement is adopted such that, by setting the threshold Vth1 of the comparator 17a to low, it is possible to roughly detect an approach of a finger to the electrodes 11a and 11b.

Also, a charging potential of the capacitor Cs1 being less affected by the parasitic capacitors, the charging potential changes greatly upon bringing a finger to a position between the electrodes 11a and 11b. For example, supposing that an area of the electrodes 11a and 11b is around 7 mm by 7 mm, and a film pressure of the insulator covering the electrodes 11a and 11b is around 100 μm, on bringing a finger to the electrodes 11a and 11b, a change in the loaded charge amount of 10 pF may be obtained. Then, when the finger is 1 mm or more away from the electrodes 11a and 11b, the change in the loaded charge amount becomes 1/10 or less because the amount is inversely proportional to the distance.

Consequently, by setting the threshold Vth1 of the comparator 17b high, the approach of a finger may be detected with a high accuracy.

Also, by using an elastic insulator to cover the electrodes 11a and 11b, and by providing a clearance between each electrode 11a and 11b and the insulator and by using a flexible insulator, an amount of change in the charge loaded into the capacitor Cs1 may be increased, and detection accuracy may be improved.

Figure 6:
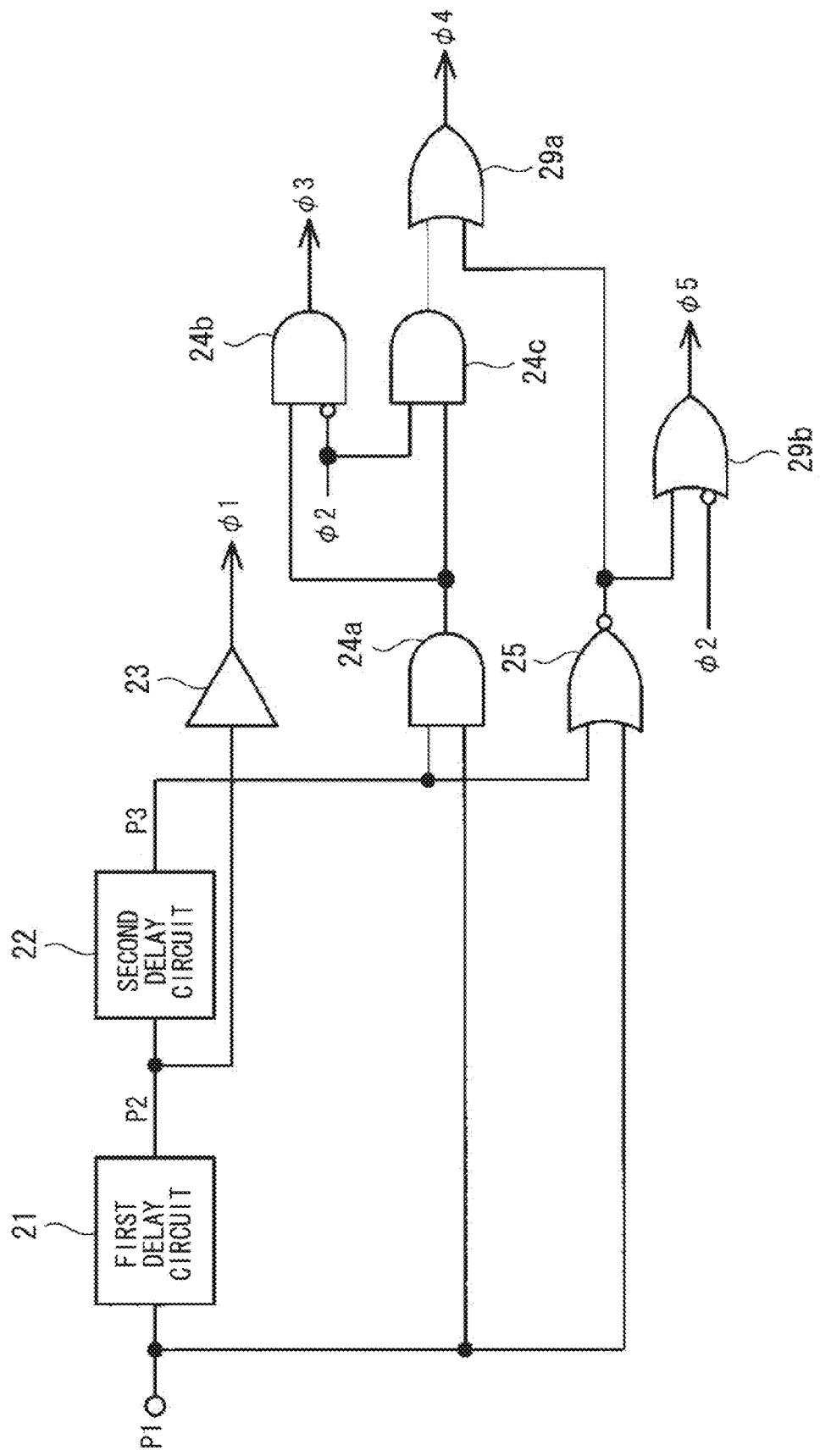
FIG. 6 is a circuit diagram illustrating a circuit which generates control signals.

FIG. 6 illustrates a circuit generating the control signals φ1, φ3, φ4 and φ5 which open and close the switches 19a, 19b, and 19d. It may be necessary to open and close the switch 19d, coupled in parallel to the feedback capacitor Cf, in a condition in which the switches 19a and 19b are rendered conductive, FIG. 6 illustrates a circuit generating the control signals φ1, φ4 and φ5.

Figure 8:
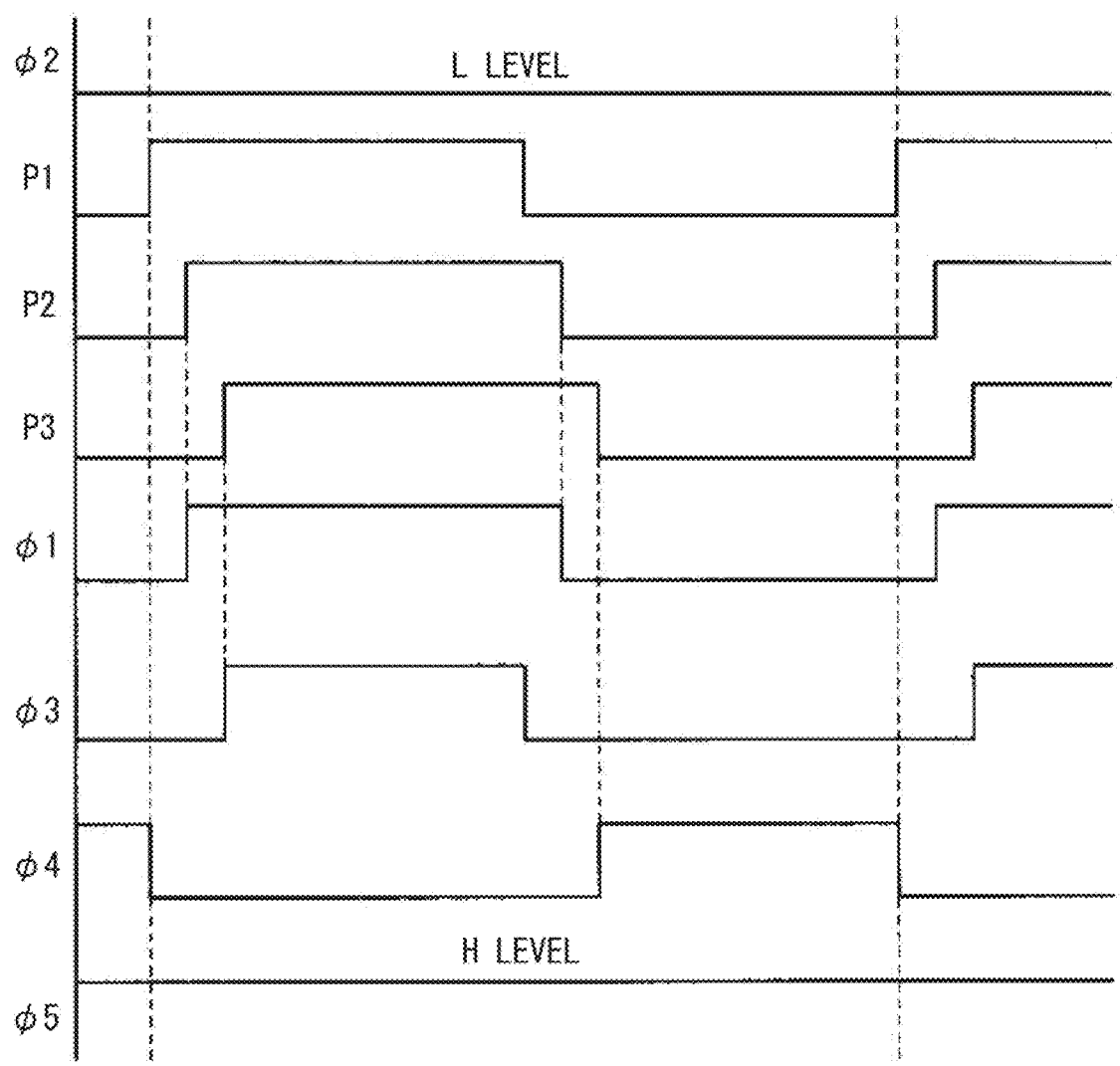
FIG. 8 is a timing waveform diagram illustrating an operation of the circuit which generates the control signals.

An input signal P1, which is a clock signal on a certain frequency, is input into a first delay circuit 21; and a signal P2, in which the input signal P1 is delayed a certain amount of time, is transmitted from the first delay circuit 21. The signal P2 is transmitted as the control signal φ1 through a buffer circuit 23. Consequently, as illustrated in FIG. 8, the control signal φ1 is a signal in which the input signal P1 is delayed by the first delay circuit 21.

The signal P2 is input into a second delay circuit 22, and a signal P3, in which the signal P2 is delayed a certain amount of time, is transmitted from the second delay circuit 22. Delay times of the first and second delay circuits 21 and 22 are substantially identical.

The signal P3 is input into an AND circuit 24a and a NOR circuit 25, and the input signal P1 is input into the AND circuit 24a and the NOR circuit 25. A signal output from the AND circuit 24a is input into AND circuits 24b and 24c, an inverted signal of the control signal φ2 is input into the AND circuit 24b, and the control signal φ2 is input into the AND circuit 24c. Then, the control signal φ3 is transmitted from the AND circuit 24b.

Signals output from the AND circuit 24c and the NOR circuit 25 are input into an OR circuit 29a, and the control signal φ4 is transmitted from the OR circuit 29a.

The signal output from the NOR circuit 25 is input into an OR circuit 29b, and the control signal φ2 is input into the OR circuit 29b. Then, the control signal φ5 is transmitted from the OR circuit 29b.

With the above configuration, the control signals φ1, φ4 and φ5 switch at the timings illustrated in FIG. 8. Consequently, the switch 19d is controlled in such a way as to switch between a conductive condition and a non-conductive condition when both switches 19a and 19b become non-conductive, and the switches 19a and 19b are controlled in such a way that one becomes non-conductive when the other is in a switching operation. By this kind of operation, errors due to a charge transfer between the capacitors Cs1, Cs2, and Cs3 in a transitional state of the switches 19a, 19b, and 19d may be reduced.

Figure 7:
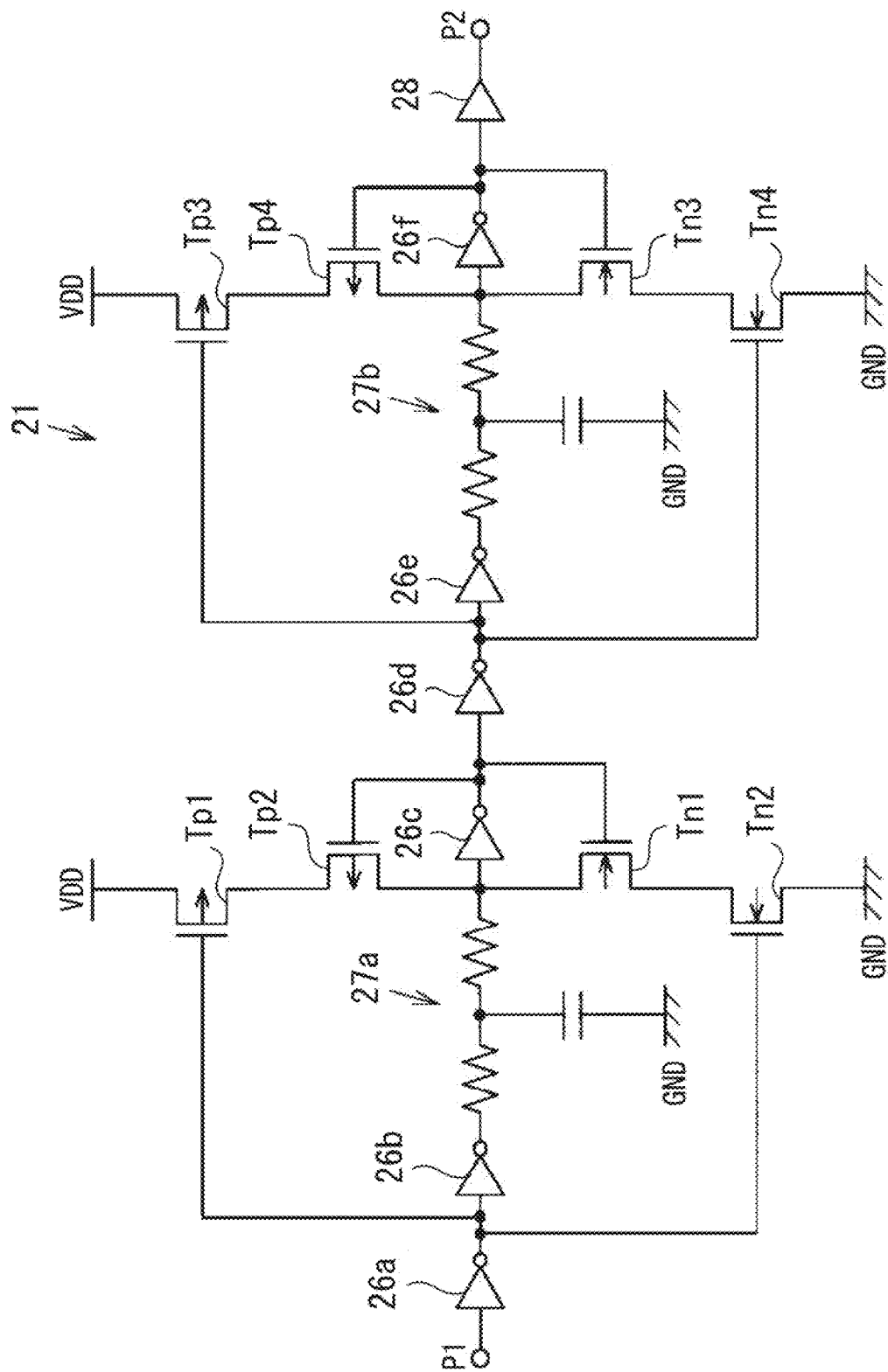
FIG. 7 is a circuit diagram illustrating a delay circuit.

FIG. 7 illustrates a specific configuration of the first delay circuit 21. The second delay circuit 22 also has substantially the same configuration. In each of these delay circuits, six inverter circuits 26a to 26f are coupled in series, and time constant circuits 27a and 27b are interposed respectively between the inverter circuits 26b and 26c, and between the inverter circuits 26e and 26f.

Also, an input terminal of the inverter circuit 26c is coupled to the power supply VDD via P channel MOS transistors Tp1 and Tp2, and coupled to the ground GND via N channel MOS transistors Tn1 and Tn2. Gates of the transistors Tp1 and Tn2 are coupled to an output terminal of the inverter circuit 26a, and gates of the transistors Tp2 and Tn1 are coupled to an output terminal of the inverter circuit 26c.

Also, an input terminal of the inverter circuit 26f is coupled to the power supply VDD via P channel MOS transistors Tp3 and Tp4, and coupled to the ground GND via N channel MOS transistors Tn3 and Tn4. Gates of the transistors Tp3 and Tn4 are coupled to an output terminal of the inverter circuit 26d, and gates of the transistors Tp4 and Tn3 are coupled to an output terminal of the inverter circuit 26f.

Then, the input signal P1 is input into an input terminal of the inverter circuit 26a, and a signal output from the inverter circuit 26f is transmitted as the signal P2 through a buffer circuit 28.

With the first delay circuit 21 configured in this way, a delay time is generated based on an operation delay time of each inverter circuit 26a to 26f and by the time constant circuits 27a and 27b, and the signal P2, which is the delayed input signal P1, is transmitted.

When a signal input into the inverter circuit 26c exceeds a threshold on a low potential side or a high potential side, the transistors Tp1, Tp2, Tn1, and Tn2, based on a signal output from the inverter circuit 26c, operate in such a way as to swiftly shift a level of the signal input into the inverter circuit 26c to a ground GND level or a power supply VDD level. The transistors Tp3, Tp4, Tn3, and Tn4 also operate in substantially the same way.

Figure 9:
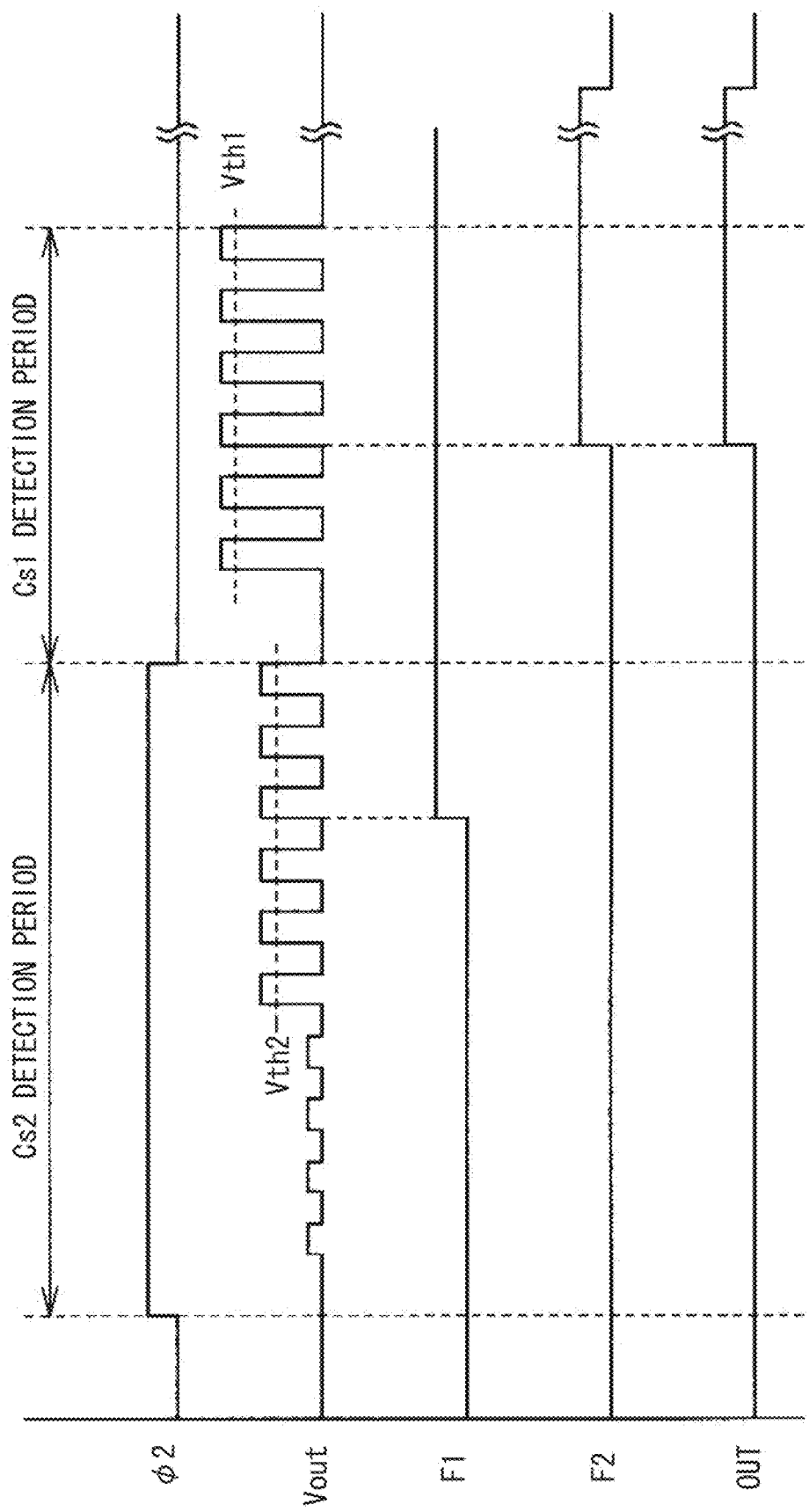
FIG. 9 is a timing waveform diagram illustrating an operation of a charging voltage detector.

FIG. 9 illustrates operations of the first and second charging voltage detectors 12a and 12b including the detection circuit 14.

Upon the control signal φ2 reaching the H level, an operation of detecting the charge loaded into the capacitor Cs2 is started, and the counter 18a is reset. Then, with the detection circuit 14, the output signal Vout is transmitted by an operation of switching between the control signals φ1, φ3, and φ4. A period of maintaining the control signal φ2 at the H level is taken to be, for example, a period until a number of pulses of the input control signal φ1 reaches "n".

Thus, by the operation of switching between the control signals φ1, φ3 and φ4, the detection voltage Vc2 is transmitted and, upon the detection voltage Vc2 exceeding the threshold Vth1 of the comparator 17a, pulse signals transmitted from the comparator 17a are counted by the counter 18a.

Then, upon a count value reaching a certain number, the detection flag F1 of the H level is transmitted from the counter 18a.

Then, upon the control signal φ2 reaching the L level, the operation of detecting the charge loaded into the capacitor Cs1 is started, and the counter 18b is reset. Then, with the detection circuit 14, the output signal Vout is transmitted by the operation of switching between the control signals φ1, φ3, and φ4. A period of maintaining the control signal φ2 at the L level is taken to be, for example, a period until a number of pulses of the input control signal φ1 reaches "m".

Thus, by the operation of switching between the control signals φ1, φ3, and φ4, the detection voltage Vc1 is transmitted and, upon the detection voltage Vc1 exceeding the threshold Vth1 of the comparator 17b, pulse signals transmitted from the comparator 17b are counted by the counter 18b. Then, upon a count value reaching a certain number, the detection flag F2 of the H level is transmitted from the counter 18b.

Then, upon the detection flags F1 and F2 both reaching the H level, a determination signal OUT indicating that a position between the electrodes 11a and 11b has been touched with a finger is transmitted from the determiner 13.

With the heretofore described capacitance sensor, the following operating effects may be obtained. 1. Roughly detecting a change in the charge loaded into the capacitor Cs2 between the electrode 11a and the ground GND by means of the detection circuit 14, then detecting a change in the charge loaded into the capacitor Cs1 between the electrodes 11a and 11b, which is easy to detect with a high accuracy, by means of the detection circuit 14 is possible. Also, based on the results of the detections, easily determining whether or not a position between the electrodes 11a and 11b has been touched with a finger is possible. 2. Detecting the detection voltage Vc2, which indicates that a change in the charge loaded into the capacitor Cs2 between the electrode 11a and the ground GND has been detected, and detecting the detection voltage Vc1, which indicates that a change in the charge loaded into the capacitor Cs1 between the electrodes 11a and 11b has been detected, in a time division manner with the shared detection circuit 14 is possible. Consequently, the scale of the detection circuit 14, which detects the detection voltages Vc2 and Vc1, may be reduced. 3. By open/close controlling the switches 19a to 19e with the control signals φ1 to φ5, detecting the detection voltages Vc2 and Vc1 in a time division manner is possible. 4. Since the switches 19a, 19b, 19d, and 19e of the detection circuit 14 are not simultaneously opened or closed, detection accuracy may be improved. 5. Generating the control signals φ1, φ3, φ4 and φ5, which do not allow the switches 19a, 19b, 19d, and 19e to be simultaneously opened or closed is possible by using the delay circuits 21 and 22, AND circuits 24a to 24c, NOR circuit 25, and OR circuits 29a and 29b. 6. Pulse signals transmitted from the comparators 17a and 17b are counted by the counters 18a and 18b and, when a count number reaches a certain value, the detection flags F1 and F2 are transmitted. Therefore, erroneous determination due to noise may be reduced if not prevented.

Figure 10:
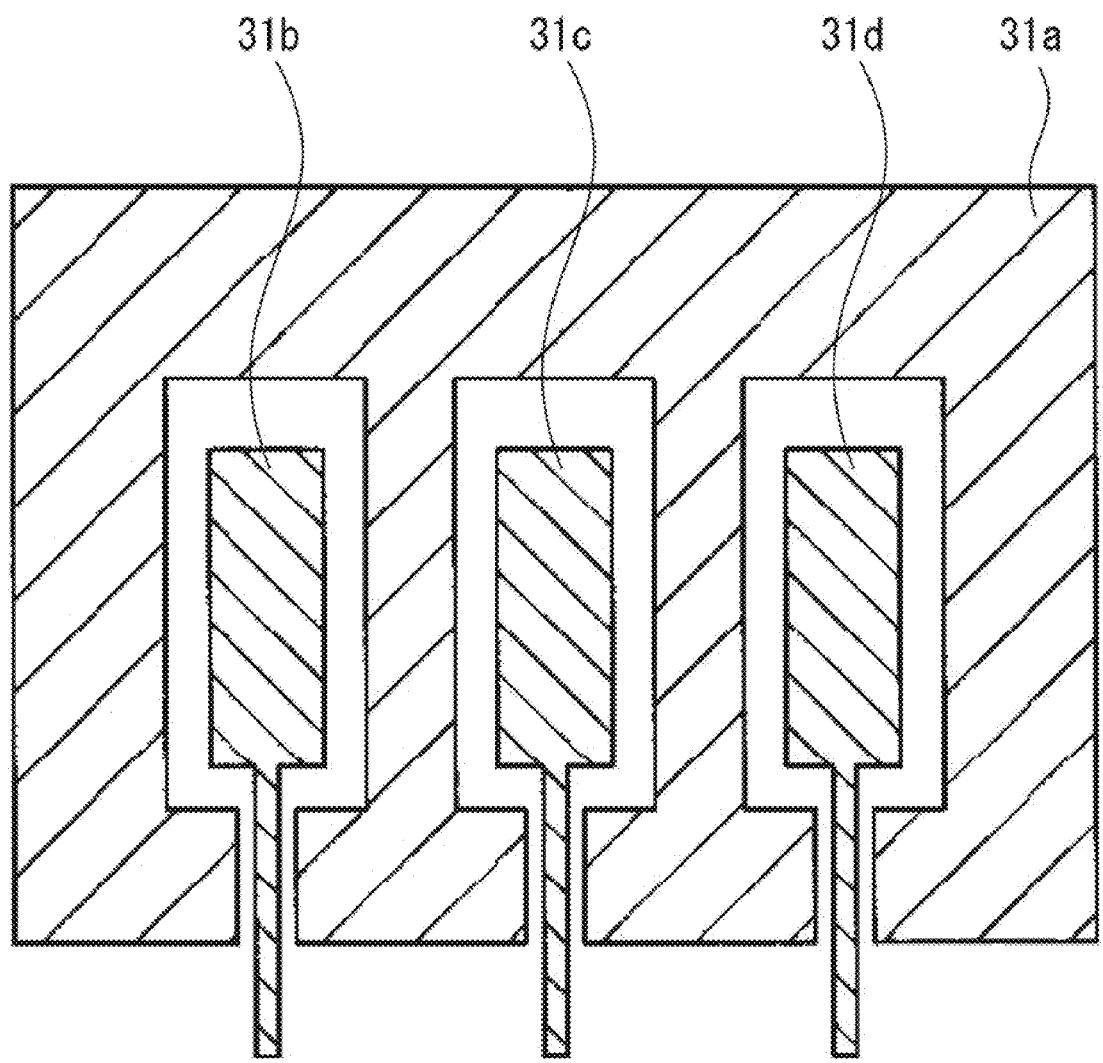
FIG. 10 is a layout diagram illustrating electrodes of a second embodiment.
Figure 11:
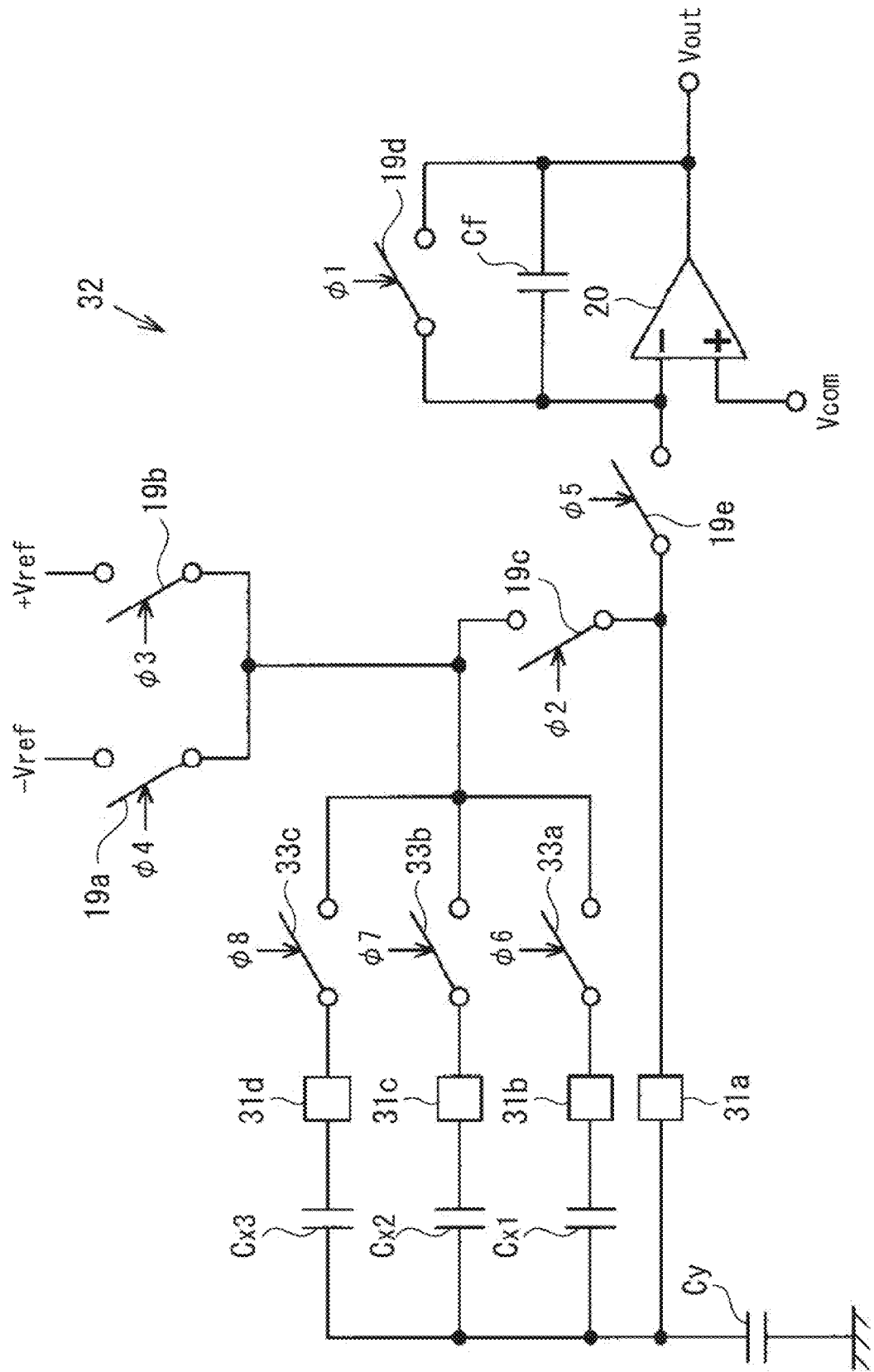
FIG. 11 is a circuit diagram illustrating a detection circuit of the second embodiment.
Figure 12:
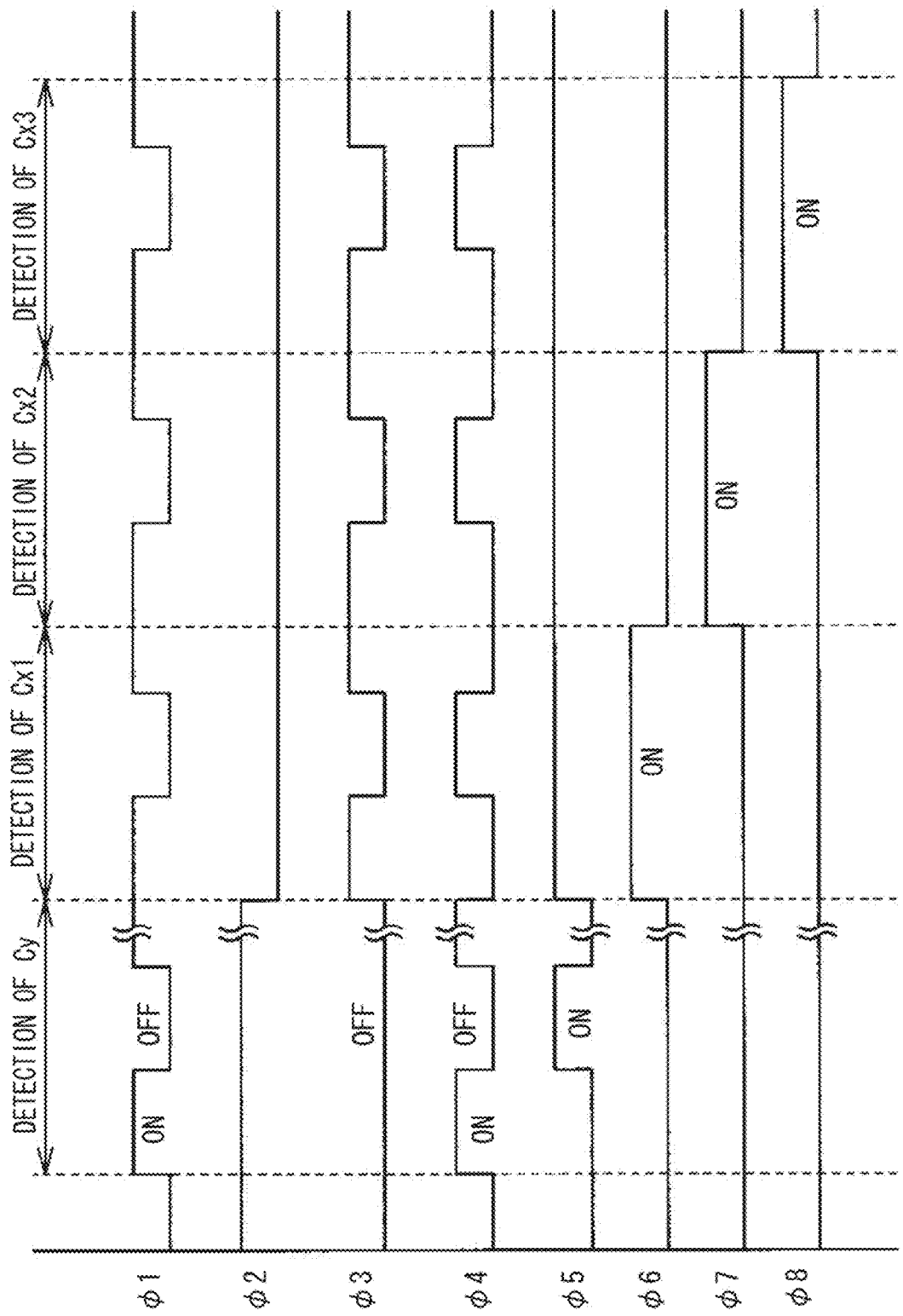
FIG. 12 is a timing waveform diagram illustrating an operation of the detection circuit.

FIGS. 10 to 12 illustrate a second embodiment. This embodiment illustrates a case of configuring a capacitance sensor that detects whether any one of three electrodes has been touched.

As illustrated in FIG. 10, three electrodes 31b to 31d of a substantially identical shape is placed side by side, and an electrode 31a is laid out between the electrodes 31b to 31d and around each electrode 31b to 31d. Then, each electrode 31a to 31d is covered with an insulating material.

FIG. 11 illustrates a detection circuit 32 of the capacitance sensor of this embodiment. Components identical to those of the detection circuit 14 of the first embodiment will be described using the same reference numbers and characters.

The electrode 31a is coupled to the negative side input terminal of an operational amplifier 20, and a capacitor Cy is provided between the electrode 31a and the ground GND.

One terminal of the switch 19c is coupled to the negative side input terminal of the operational amplifier 20, and switches 33a to 33c are coupled between the other terminal of the switch 19c and each electrode 31b to 31d respectively. The switches 33a to 33c, are open/close-controlled by control signals $\phi6$ to $\phi8$, and are rendered conductive when the control signals $\phi6$ to $\phi8$ reach the H level.

Capacitors Cx1, Cx2, and Cx3 are provided between the electrode 31a and each electrode 31b to 31d, respectively.

FIG. 12 illustrates timing waveforms of the control signals $\phi1$ to $\phi8$ which open/close-control the switches 19a to 19d and 33a to 33c. Firstly, in a condition in which the control signal $\phi2$ is set at the H level and the switch 19c is rendered conductive, upon the control signals $\phi1$ and $\phi4$ switching in the same phase in a certain period, and the control signal $\phi5$ switching in a reverse phase, a voltage loaded into the capacitor Cy between the electrode 31a and the ground GND is detected and transmitted as the output signal Vout.

Then, the control signals $\phi6$ to $\phi8$ sequentially reach the H level in a condition in which the control signal $\phi2$ reaches the L level, the switch 19c becomes non-conductive, the control signals $\phi1$ and $\phi3$ switch in the same phase in the certain period, and the control signal $\phi4$ switches in a reverse phase to that of the control signals $\phi1$ and $\phi3$.

Thus, the switches 31b to 31c sequentially become conductive, and voltages loaded into the capacitors Cx1, Cx2, and Cx3 between the electrode 31a and each electrode 31b to 31d are sequentially detected and transmitted as the output signals Vout.

By determining, based on the kinds of output signals Vout, whether or not the voltage loaded into the capacitor Cy has exceeded a certain threshold, and furthermore, whether or not any one of the voltages loaded into the capacitors Cx1 Cx2, and Cx3 has exceeded a certain threshold, which of positions on the electrodes 31b to 31d a finger has touched may be determined.

For example, in the event that an increase in the voltage loaded into the capacitor Cx1 is detected following an increase in the voltage loaded into the capacitor Cy, the fact that a position on the electrode 31b has been touched may be detected. Also, in the event that an increase in the voltage loaded into the capacitor Cx2 is detected following the increase in the voltage loaded into the capacitor Cy, the fact that a position on the electrode 31c has been touched may be detected. In the same way, in the event that an increase in the voltage loaded into the capacitor Cx3 is detected following the increase in the voltage loaded into the capacitor Cy, the fact that a position on the electrode 31c has been touched may be detected.

With this kind of configuration, a capacitance sensor for a touch sensor switch provided with three touch sensor sections in combination may be configured.

Figure 13:
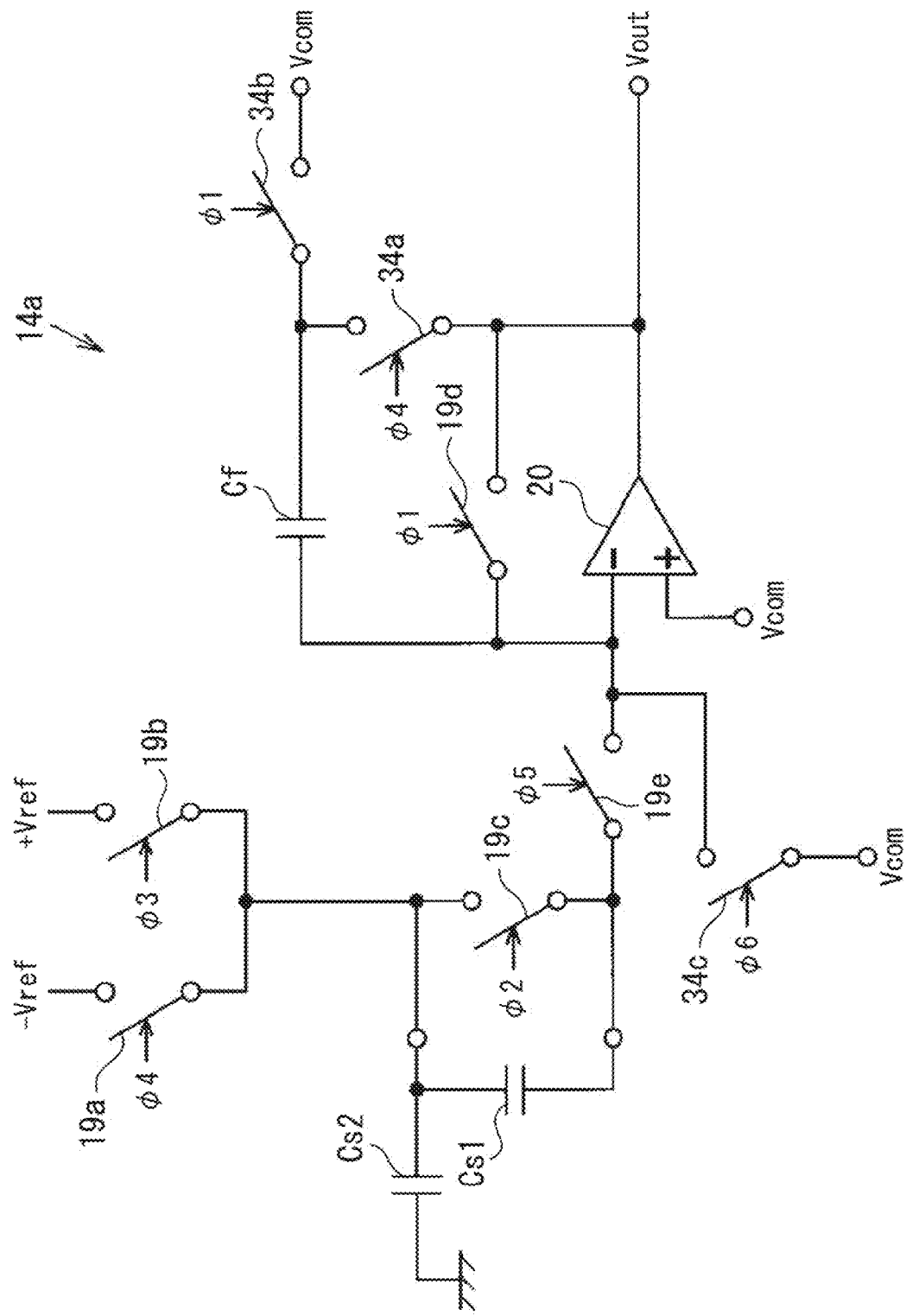
FIG. 13 is a circuit diagram illustrating a detection circuit of a third embodiment.
Figure 14:
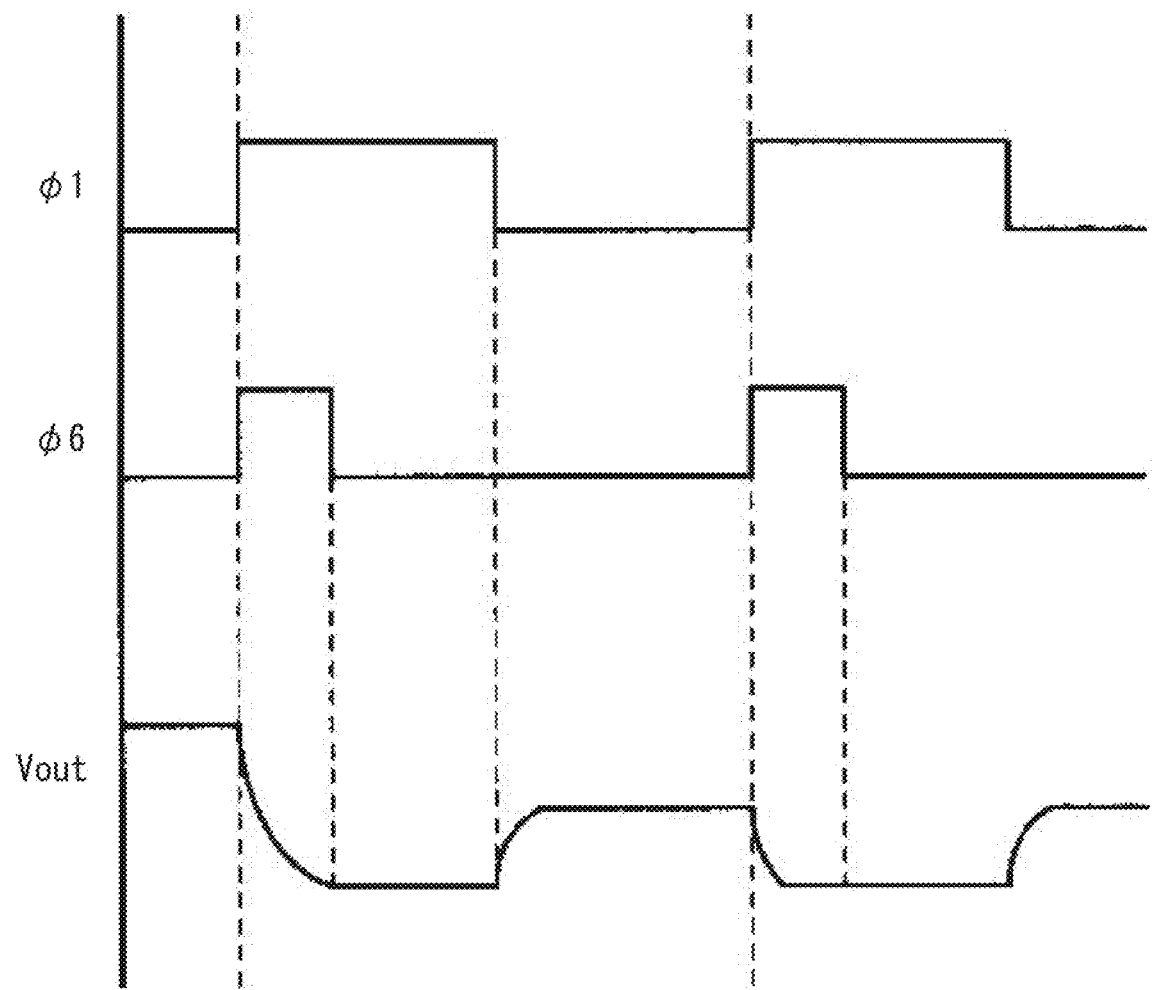
FIG. 14 is a timing waveform diagram illustrating an operation of the detection circuit of the third embodiment.
Figure 15:
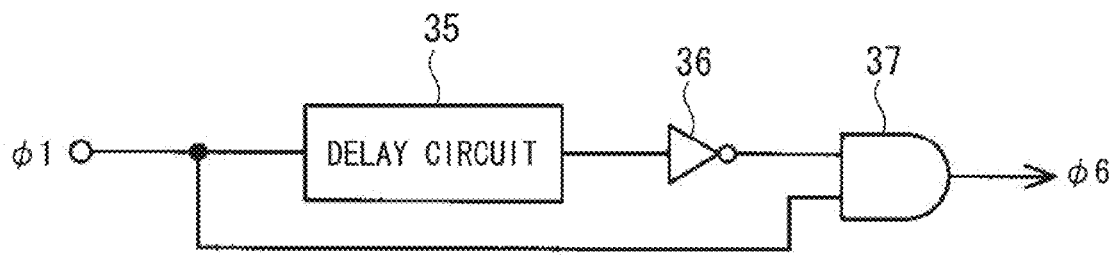
FIG. 15 is a circuit diagram illustrating a control signal generation circuit.

FIGS. 13 to 15 illustrate a third embodiment. This embodiment is one which configures a detection circuit 14a in which a function of canceling an offset voltage of the operational amplifier 20 is added to the detection circuit 14 of the first embodiment illustrated in FIG. 4. Components similar to those of the first embodiment will be described with the same reference numbers and characters.

A switch 34a is coupled between the feedback capacitor Cf and the output terminal of the operational amplifier 20, and the switch 34a is open/close-controlled by the control signal $\phi4$.

Also, the reference voltage Vcom is supplied through a switch 34b to a connection point between the feedback capacitor Cf and the switch 34a. The switch 34b is open/close controlled by the control signal $\phi1$.

With this kind of detection circuit 14a, when the control signal $\phi1$ reaches the H level, and the switch 19d becomes conductive, a gain of the operational amplifier 20 becomes 1 while, in the event that there is no offset voltage in the operational amplifier 20, the output signal Vout reaches the reference voltage Vcom.

Since the switch 34b also becomes conductive at this time, in the event that an offset voltage exists in the operational amplifier 20, the feedback capacitor Cf is charged with an amount equivalent to the offset voltage. Then, the switch 19d becomes non-conductive and, when detecting charges loaded into the capacitors Cs2 and Cs1, an output signal Vout, which has canceled the offset voltage of the operational amplifier 20, is transmitted.

Also, the signal Vout output from the operational amplifier 20 may not immediately reach the reference voltage Vcom even when the control signal $\phi1$ becomes conductive. This is because it takes time to charge and discharge a capacitor coupled to the input terminal of the operational amplifier 20.

When increasing a load drive ability of the operational amplifier 20 in order to avoid this, power consumption is increased. Also, when reducing the load drive ability of the operational amplifier 20, a reduction of the output signal Vout to the reference voltage Vcom is delayed.

With the detection circuit 14a, the reference voltage Vcom is supplied to the input terminal of the operational amplifier 20 through the switch 34c which is open/close-controlled by the control signal $\phi6$.

The control signal $\phi6$ is generated from the control signal $\phi1$ by the generation circuit illustrated in FIG. 15. That is, the control signal $\phi1$ is input into a delay circuit 35, and a signal output from the delay circuit 35 is input into an AND circuit 37 through an inverter circuit 36. Also, the control signal $\phi1$ is input into the AND circuit 37, and the control signal $\phi6$ is transmitted from the AND circuit 37.

As illustrated in FIG. 14, the control signal $\phi6$ rises along with a rise of the control signal $\phi1$, reaches the H level and, after a delay time set by the delay circuit 35, returns to the L level prior to the fall of the control signal $\phi1$.

Consequently, upon the control signal $\phi1$ reaching the H level, and the switch 19d becoming conductive, the control signal $\phi6$ also reaches the H level, the switch 34c becomes conductive, and the input terminal of the operational amplifier 20 swiftly reaches the reference voltage Vcom level. As a result, as illustrated in FIG. 14, the signal Vout output from the operational amplifier 20 swiftly reaches the reference voltage Vcom level.

With the detection circuit 14a configured as described above, the following operational effects may be obtained. 1. The offset voltage of the operational amplifier 20 may be cancelled. 2. When the output signal Vout is reset to the reference voltage Vcom, the reset operation may be sped up.

Figure 16:
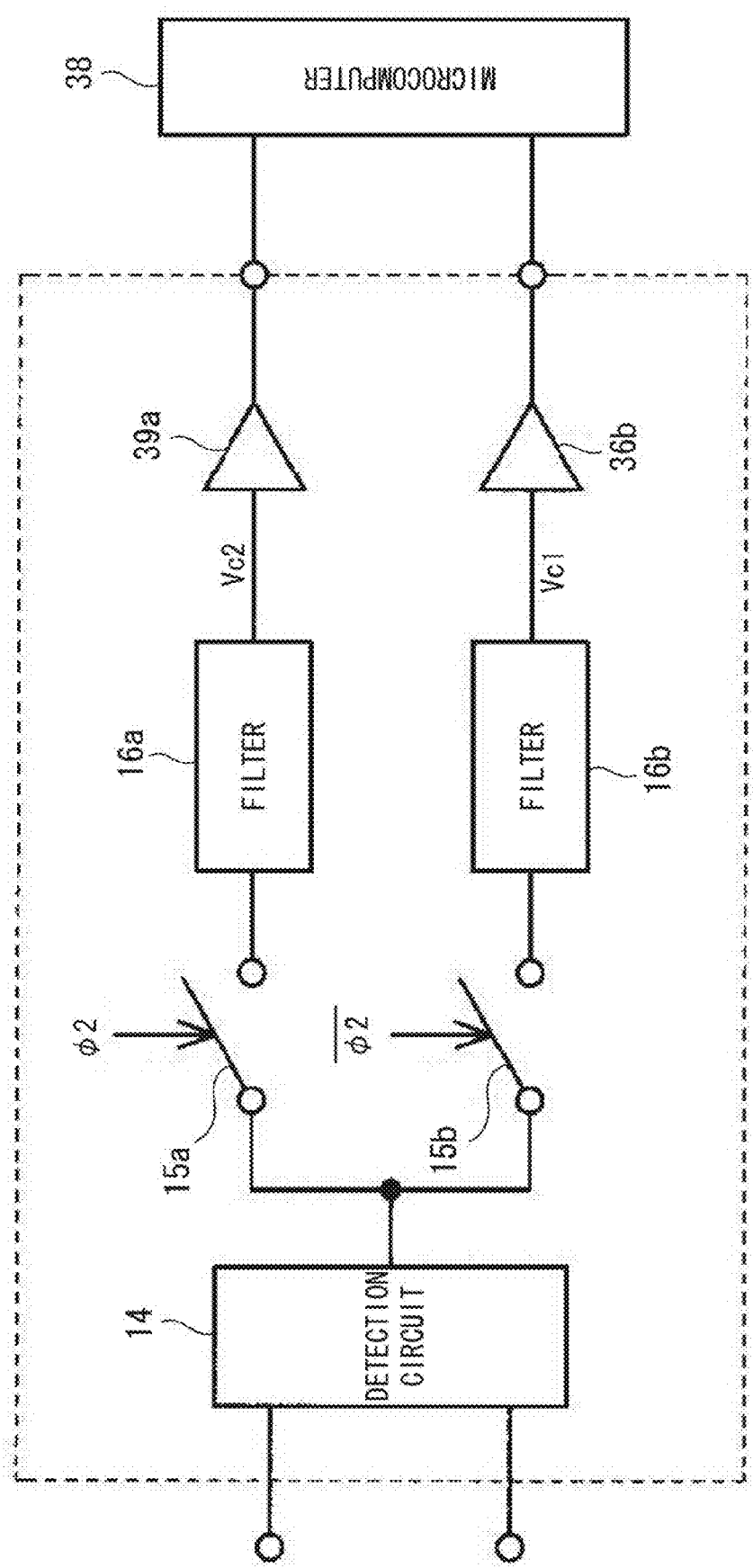
FIG. 16 is a block diagram illustrating a fourth embodiment.

FIG. 16 illustrates a fourth embodiment. This embodiment is one which is arranged in such a way that the operations of the comparators 17a and 17b, counters 18a and 18b, and determiner 13 of the first embodiment are carried out by a microcomputer 38. Components similar to those of the first embodiment will be described with the same reference numbers and characters.

The detection voltages Vc2 and Vc1 transmitted from the filters 16a and 16b are input into the microcomputer 38 through amplifiers 39a and 39b, respectively. The microcomputer 38 converts analog signals input from the amplifiers 39a and 39b into digital signals by an A/D converter, determines based on the digital signals whether or not the detection voltages Vc2 and Vc1 exceed a certain threshold, and detects whether or not the electrode 11a has been touched with a finger.

With this kind of configuration, with an apparatus furnished with the microcomputer 38, a detection signal from the capacitance sensor may be determined without providing the comparators 17a and 17b, counters 18a and 18b, or determiner 13 of the first embodiment.

Figure 17:
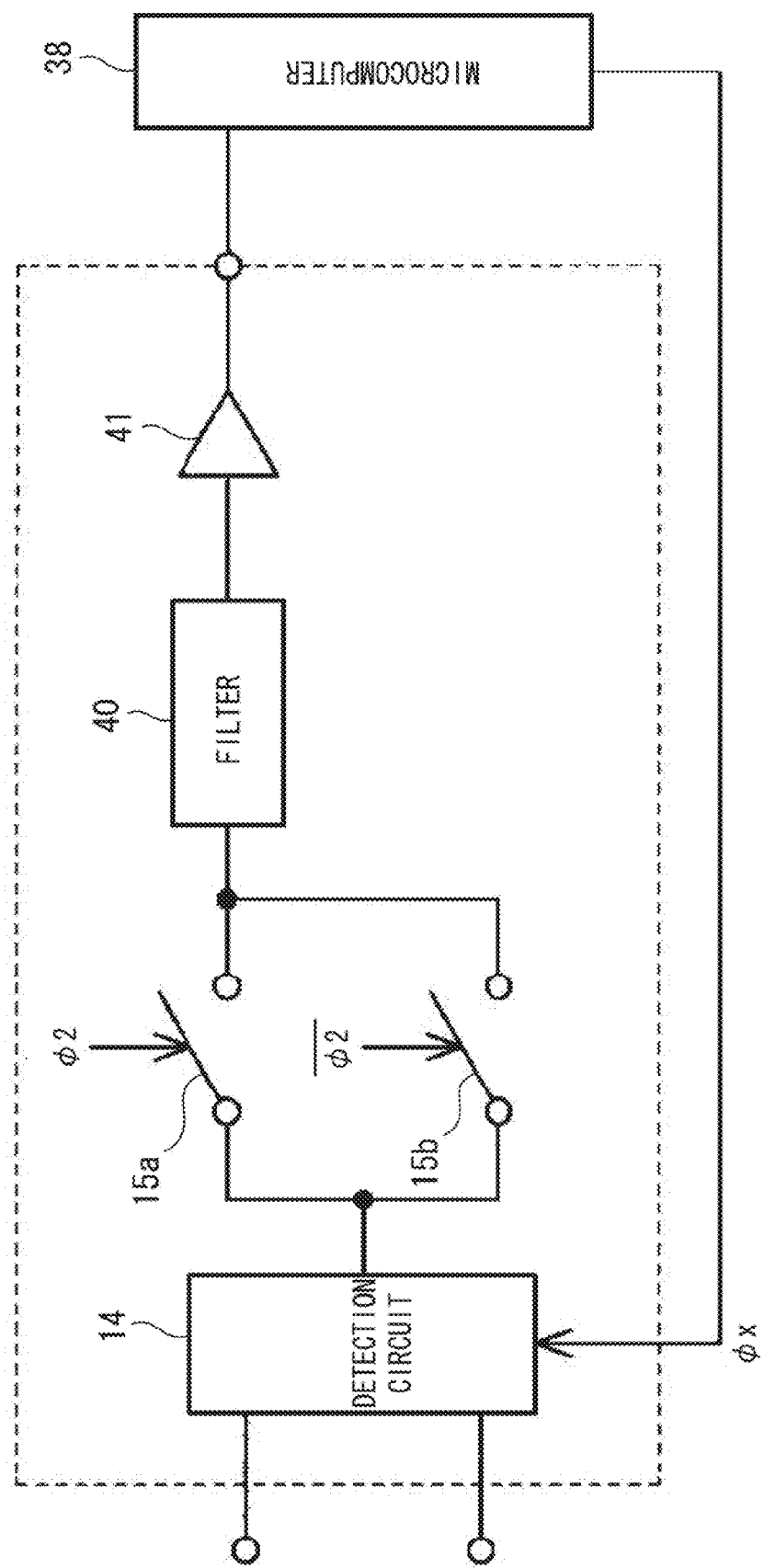
FIG. 17 is a block diagram illustrating a modification example of the fourth embodiment.
Figure 18:
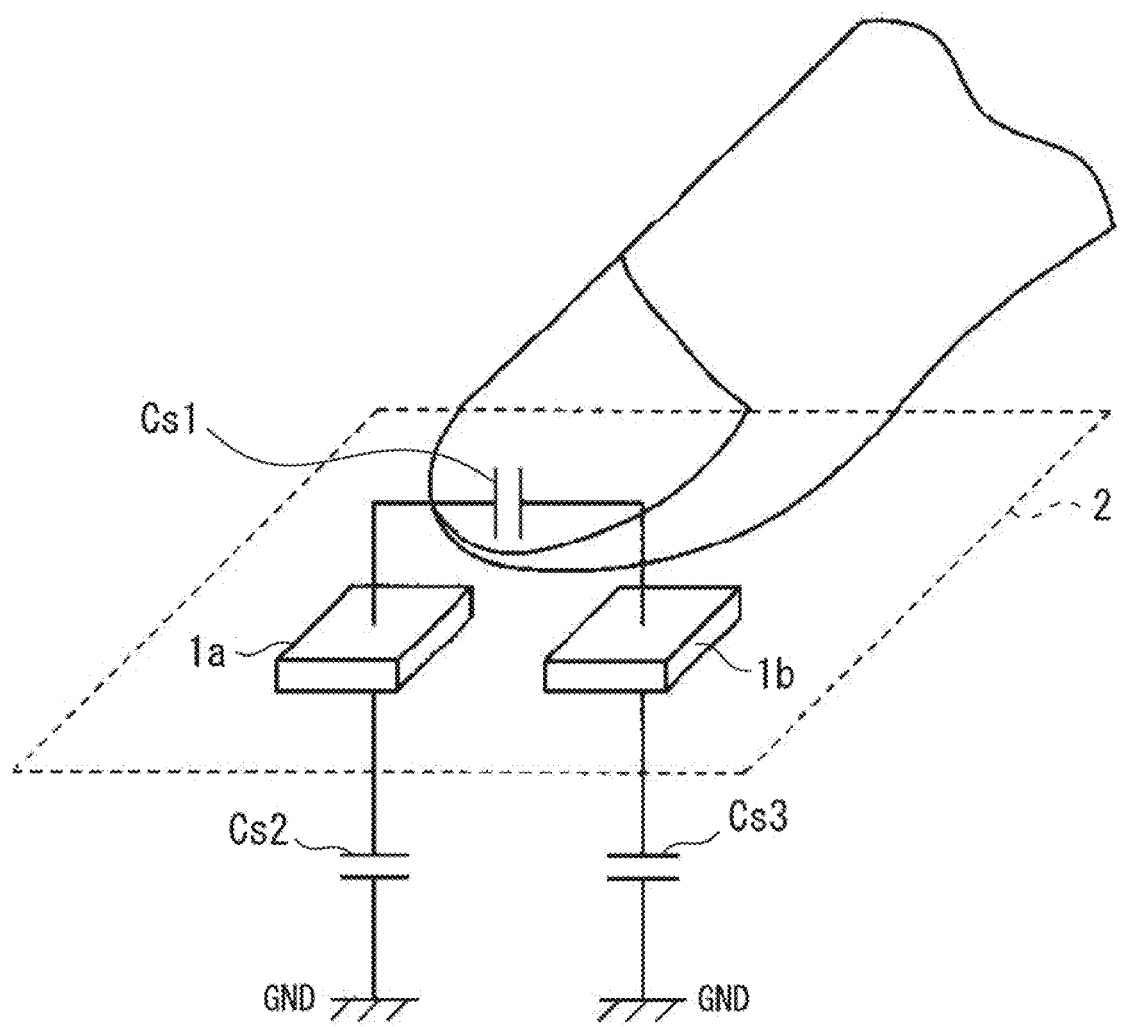
FIG. 18 is a perspective view illustrating a capacitance sensor operation example.

FIG. 17 illustrates a configuration such that, by controlling an operation of detecting the detection voltages Vc2 and Vc1 in the detection circuit 14, based on a control signal $_\phi x$ transmitted from the microcomputer 38, the detection voltages Vc2 and Vc1 are transmitted to the microcomputer 38 through a shared filter 40 and amplifier 41.

With this kind of configuration, sharing the filter 40 and amplifier 41, and reducing a circuit scale of the capacitance sensor in comparison with the configuration illustrated in FIG. 16 is possible.

The heretofore described embodiments can be implemented in a manner illustrated hereafter. Since a change in the charge loaded into the capacitor Cs1 between the electrodes 11a and 11b can be detected with a high accuracy in the first embodiment, signals output from the comparator 17b may be input into the determiner 13 as the detection flag F2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A capacitance sensor comprising:
a first charging voltage detector configured to detect a change in a voltage loaded into a first capacitor between a first electrode and a ground terminal;
a second charging voltage detector configured to detect a change in a voltage loaded into a second capacitor between the first electrode and a second electrode; and
a determiner configured to generate a determination signal based on a detection voltage transmitted from each of the first charging voltage detector and second charging voltage detector,
wherein the first charging voltage detector includes:
a first comparator configured to compare a first detection voltage obtained from the first detection operation of the detection circuit with a first threshold;
a first counter configured to count an output from the first comparator,
the second charging voltage detector includes:
a second comparator configured to compare a second detection voltage obtained from the second detection operation of the detection circuit with a second threshold;
a second counter configured to count an output from the second comparator,
wherein the determiner is configured to output the determination signal when detecting an output of the first counter and an output of the second counter.

2. The capacitance sensor according to claim 1, wherein the first charging voltage detector includes a detection circuit configured to detect the voltage loaded into the first capacitor, and the second charging voltage detector includes a detection circuit configured to detect the charge in voltage loaded into the second capacitor, wherein
a first detection operation configured to detect the charge in voltage loaded into the first capacitor, and a second detection operation configured to detect the charge in voltage loaded into the second capacitor, are carried out in a time division manner by a shared detection circuit.

3. The capacitance sensor according to claim 2, wherein the shared detection circuit includes:
an operational amplifier having an output terminal and an input terminal coupled one of the first capacitor and second capacitor selectively; and
a first switch coupled between the input terminal and the output terminal,
wherein
when the first switch becomes conductive, a low potential side reference voltage is supplied to the first and second capacitors, when the first switch becomes non-conductive, a high potential side reference voltage is supplied to the first and second capacitors.

4. The capacitance sensor according to claim 3, further comprising:
a generation circuit configured to generate a control signal which open/close-controls each of the first to fourth switches and, after rendering the third switch non-conductive, renders the first switch conductive, then renders the fourth switch conductive.

5. The capacitance sensor according to claim 3, further comprising:
a switch configured to couple a plurality of third capacitors between a plurality of third electrodes to the operational amplifier.

6. The capacitance sensor according to claim 3, further comprising:
a switch configured to, when the first switch conducts, supply a reference voltage to be input into the operational amplifier to the output terminal of the operational amplifier.

7. The capacitance sensor according to claim 3, wherein the reference voltage is supplied to the input terminal of the operational amplifier through a switch which becomes conductive concurrently with the first switch, and becomes non-conductive prior to the first switch becoming non-conductive.

8. The capacitance sensor according to claim 3, wherein the determiner is a microcomputer which A/D converts the detection voltages transmitted from the first and second charging voltage detectors into digital signals and, based on the digital signals, generates the determination signal.

9. The capacitance sensor according to claim 3, wherein the shared detection circuit further includes:
a feedback capacitor provided between the input terminal and the output terminal;
a second switch configured to select one of the first capacitor and second capacitor to be coupled to the input terminal of the operational amplifier;

a third switch configured to, when conducting, supply the low potential side reference voltage to the first capacitor and the second capacitor; and a fourth switch configured to, when conducting, supply the high potential side reference voltage to the first capacitor and the second capacitor, wherein the signal output from the operational amplifier is reset when the first switch becomes conductive.

10. The capacitance sensor according to claim 1, wherein the first comparator, when the first detection voltage exceeds the first threshold, transmits an output signal having a first level; and the first counter configured to transmit a first detection flag based on a count value, the second comparator, when the second detection voltage exceeds the second threshold, to transmit an output signal having a first level; and the second counter configured to transmit a second detection flag based on a count value, and wherein the determiner generates the determination signal based on the first and second detection flags.

11. The capacitance sensor according to claim 10, wherein the second threshold is set at a voltage higher than the first threshold.

12. The capacitance sensor according to claim 1, wherein the second electrode is connected to a third capacitor connected between the second electrode and the ground terminal.

13. The capacitance sensor according to claim 1,
wherein the first electrode and the second electrode are disposed under a touch surface.

14. The capacitance sensor according to claim 1, wherein the capacitance sensor is a touch sensor.

15. A capacitance sensor comprising:
a first charging voltage detector configured to detect a change in a voltage loaded into a first capacitor between a first electrode and a ground terminal;
a second charging voltage detector configured to detect a change in a voltage loaded into a second capacitor between the first electrode and a second electrode; and
a determiner configured to generate a determination signal based on a detection voltage transmitted from each of the first charging voltage detector and second charging voltage detector, wherein the first charging voltage detector includes a detection circuit configured to detect the voltage loaded into the first capacitor, and the second charging voltage detector includes a detection circuit configured to detect the charge in voltage loaded into the second capacitor, wherein a first detection operation configured to detect the charge in voltage loaded into the first capacitor, and a second detection operation configured to detect the charge in voltage loaded into the second capacitor, are carried out in a time division manner by a shared detection circuit, wherein the shared detection circuit includes:
an operational amplifier having an output terminal and an input terminal coupled one of the first capacitor and second capacitor selectively; and
a first switch coupled between the input terminal and the output terminal,
wherein, when the first switch becomes conductive, a low potential side reference voltage is supplied to the first and second capacitors and, when the first switch becomes non-conductive, a high potential side reference voltage is supplied to the first and second capacitors.

16. The capacitance sensor according to claim 15, wherein the shared detection circuit further includes:
a feedback capacitor provided between the input terminal and the output terminal;
a second switch configured to select one of the first capacitor and second capacitor to be coupled to the input terminal of the operational amplifier;
a third switch configured to, when conducting, supply the low potential side reference voltage to the first capacitor and the second capacitor; and
a fourth switch configured to, when conducting, supply the high potential side reference voltage to the first capacitor and the second capacitor,
wherein the signal output from the operational amplifier is reset when the first switch becomes conductive.

* * * * *